(12) United States Patent
Noguchi et al.

(10) Patent No.: US 7,258,932 B2
(45) Date of Patent: Aug. 21, 2007

(54) POLYMERIC FLUORESCENT SUBSTRATE AND POLYMER LIGHT-EMITTING DEVICE USING THE SAME

(75) Inventors: Takanobu Noguchi, Tsukuba (JP); Shuji Doi, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 10/193,761

(22) Filed: Jul. 12, 2002

(65) Prior Publication Data

US 2003/0068527 A1    Apr. 10, 2003

(30) Foreign Application Priority Data

Jul. 19, 2001  (JP) .............................. 2001-219495

(51) Int. Cl.
*H01J 1/62* (2006.01)
*C09K 11/06* (2006.01)

(52) U.S. Cl. .................. 428/690; 428/917; 313/504; 313/506; 252/301.35; 257/40; 257/103; 528/422; 526/310

(58) Field of Classification Search ........... 428/690, 428/917; 313/504, 506; 257/40, 103; 252/301.35, 252/301.16; 528/422; 526/310
See application file for complete search history.

(56) References Cited

U.S. PATENT DOCUMENTS

| | | | |
|---|---|---|---|
| 5,654,481 A | 8/1997 | Anzai et al. | |
| 5,681,664 A | 10/1997 | Tamano et al. | |
| 5,814,224 A | 9/1998 | Krueder et al. | |
| 5,814,244 A * | 9/1998 | Kreuder et al. | ........ 252/301.16 |
| 5,821,002 A * | 10/1998 | Ohnishi et al. | ............. 428/690 |
| 5,972,247 A * | 10/1999 | Shi et al. | .................... 252/583 |
| 6,022,998 A | 2/2000 | Kawaguchi et al. | |
| 6,150,043 A * | 11/2000 | Thompson et al. | ......... 428/690 |
| 6,338,927 B1 | 1/2002 | Inagaki et al. | |
| 6,414,104 B1 * | 7/2002 | Pei | .............................. 528/86 |
| 6,489,045 B1 * | 12/2002 | Araki et al. | ................ 428/690 |
| 2001/0017155 A1 | 8/2001 | Bellman et al. | |

FOREIGN PATENT DOCUMENTS

| | | |
|---|---|---|
| DE | 36 10 649 A1 | 10/1987 |
| EP | 992564 A | 4/2000 |
| EP | 1281745 A | 9/2004 |
| JP | 10-013553 A | 1/1989 |
| JP | 07-090255 | 4/1995 |
| JP | 8-100038 A | 4/1996 |
| JP | 9-255774 A | 9/1997 |
| JP | 10-306143 A | 11/1998 |
| JP | 2001-098176 A | 4/2001 |
| JP | 94878 | 3/2003 |
| WO | WO99/20675 A1 | 4/1999 |
| WO | WO 2000/055927 A | 9/2000 |

OTHER PUBLICATIONS

L. Tan et al., "New Aromatic Benzazole Polymers. I. Benzobisthiazole and Benzobisoxazole Polymers with Main-Chain Triarylamino Units", J. Polymer Sci., Part A: Polym. Chem., 35(10), 1997, pp. 1909-1924 with Abstract.

European Search Report for Corresponding European Patent Application, No. EP 02 25 5038, dated Sep. 11, 2002, N/A.

M. Redecker, et al., "High Mobility Hole Transport Fluorene-Triarylamine Copolymers", *Advanced Materials* (1999), vol. 11, No. 3, pp. 341-346, N/A.

* cited by examiner

*Primary Examiner*—Rena Dye
*Assistant Examiner*—Camie S. Thompson
(74) *Attorney, Agent, or Firm*—Sughrue Mion, PLLC

(57) ABSTRACT

A polymeric fluorescent substance exhibiting visible fluorescence in the solid state, having polystyrene reduced number average molecular weight of $1 \times 10^3$ to $1 \times 10^8$, and comprising one or more repeating units of following formula (1),

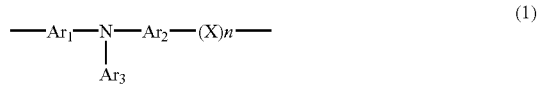

(1)

wherein $Ar_1$ and $Ar_2$ each independently represent an arylene group or the like; $Ar_3$ represents an aryl group or the like having one or more substituents of formula (2) as nuclear substitution; X represents $—CR_1=CR_2—$ or $—C≡C—$; and n is 0 or 1,

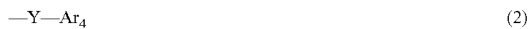

(2)

wherein $Ar_4$ represents an aryl group or the like; and Y represents $—CR_3=CR_4—$ or $—C≡C—$. The triarylamine type polymeric fluorescent substance is excellent in quantum yield of fluorescence and in light emitting efficiency when made into a device.

19 Claims, No Drawings

POLYMERIC FLUORESCENT SUBSTRATE AND POLYMER LIGHT-EMITTING DEVICE USING THE SAME

BACKGROUND OF THE INVENTION

1. Field of the Invention

The present invention relates to a polymeric fluorescent substance, a polymer light emitting device (hereinafter, referred to as polymer LED) containing the same in an light emitting layer, and a device using the same.

2. Description of the Related Art

Light-emitting materials having higher molecular weight (polymeric fluorescent substance) are variously investigated since they are soluble in a solvent and can form a light-emitting layer in a light-emitting device by an application method, differing from those having lower molecular weight.

For example, a polymeric fluorescent substance containing a repeating unit derived from triarylamine (hereinafter, sometimes referred to as triarylamine type polymeric fluorescent substance) have been studied. JP-A9-255774 discloses those comprising a repeating unit derived from triarylamine and a repeating unit of polyether ketone. WO 99/20675 discloses those comprising a repeating unit derived from triarylamine and a repeating unit of fluorene.

However, the above known triarylamine type polymeric fluorescent substance still has been insufficient in quantum yield of fluorescence, and in light emitting efficiency when made into a device.

An object of the present invention is to provide a triarylamine type polymeric fluorescent substance which is excellent in quantum yield of fluorescence, and in light emitting efficiency when made into a device.

SUMMARY OF THE INVENTION

The present inventors have intensively studied and found that triarylamine type polymeric fluorescent substance having a specific substituent as the side chain is excellent in quantum yield of fluorescence, and in light emitting efficiency when made into a device.

Namely, the present inventions relates to [1] a polymeric fluorescent substance exhibiting visible fluorescence in the solid state, having polystyrene reduced number average molecular weight of $1 \times 10^3$ to $1 \times 10^8$, and comprising one or more repeating units of following formula (1),

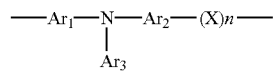
(1)

wherein $Ar_1$ and $Ar_2$ each independently represent an arylene group or a divalent heterocyclic compound group; $Ar_3$ represents an aryl group or a monovalent heterocyclic compund group having one or more substituents of formula (2) as nuclear substitution; X represents —$CR_1$=$CR_2$— or —C≡C—; $R_1$ and $R_2$ each independently represent a group selected from a hydrogen atom, an alkyl group, an aryl group, a monovalent heterocyclic compound group, and cyano group; n is 0 or 1, —Y—$Ar_4$ (2)

wherein $Ar_4$ represents an aryl group, a monovalent heterocyclic compound group or a monovalent aromatic amine group; Y represents —$CR_3$=$CR_4$— or —C≡C—; $R_3$ and $R_4$ each independently represent a group selected from a hydrogen atom, an alkyl group, an aryl group, a monovalent heterocyclic compound group and cyano group. The present invention also relates to a polymer light-emitting device comprising at least a light emitting layer between a pair of electrodes composed of anode and a cathode at least one of which is transparent or semi-transparent wherein the light emitting layer comprises a polymeric fluorescent substance of the above [1]. The present invention also provides [2] a polymer light emitting device comprising at least a light emitting layer between a pair of electrodes composed of an anode and a cathode at least one of which is transparent or semi-transparent wherein the light emitting layer contains a polymeric fluorescent substance according to [1]. Further, the present invention provides a flat light source, a segment display, and a dot matrix display all obtained by using the polymer light emitting device. The present invention also provides a liquid crystal display obtained by using the polymer LED as a back-light.

DETAILED DESCRIPTION OF THE INVENTION

The polymeric fluorescent substance of the present invention exhibits visible fluorescence in the solid state, has a polystyrene reduced number average molecular weight of $1 \times 10^3$ to $1 \times 10^8$, and comprises one or more repeating units of the above formula (1). The total amount of the repeating unit represented by formula (1) is suitably 1% by mole or more and 100% by mole or less based on all repeating units.

$Ar_1$ and $Ar_2$ each independently represent an arylene group or a divalent heterocyclic compound group. $Ar_3$ represents an aryl group or a monovalent heterocyclic compound group having one or more substituents of the above formula (2) as nuclear substitution. Here, $Ar_1$, $Ar_2$ and $Ar_3$ may have a substituent other than the group represented by the above formula (2). As for them, when $Ar_1$, $Ar_2$, or $Ar_3$ have a plurality of substituents, they may be mutually the same or different. As the substituents other than the group shown by the above formula (2), exemplified are an alkyl group, alkoxy group, alkylthio group, alkyl silyl group, an alkyl amino group, an aryl group, aryloxy group, an aryl alkyl group, aryl alkoxy group, aryl alkenyl group, aryl alkynyl group, an aryl amino group, and a monovalent heterocyclic compound group.

In the present invention, the arylene group is an atomic group of an aromatic hydrocarbon in which two hydrogen atoms are removed, and has usually about 6 to 60 carbon atoms. The number of carbon atoms of the substituent is not counted as the number of carbon atoms of the arylene group. The aromatic hydrocarbon is a hydrocarbon used as a matrix of an aromatic compound, which contains a benzene ring. The aromatic hydrocarbon also includes those containing a condensed ring, and two or more of independent benzene rings or condensed rings bonded through a group such as a direct bond, a vinylene group or the like.

As the arylene group, exemplified are phenylene group (for example, following formulas 1-3), naphthalenediyl group (following formulas 4-13), anthracenylene group (following formulas 14-19), biphenylene group (following formulas 20-25), triphenylene group (following formulas 26-28), condensed ring compound group (following formulas 29-38), etc. Among them, phenylene group, biphenylene group, and fluorene-diyl group (following formulas 36-38) are preferable.

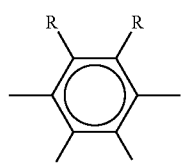
1
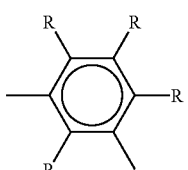
2
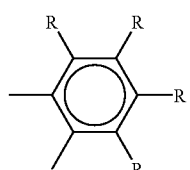
3
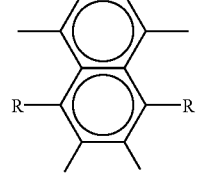
4
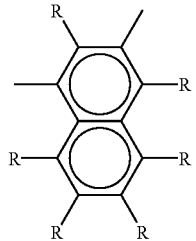
5
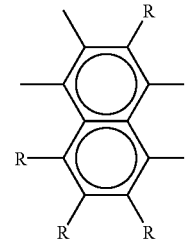
6
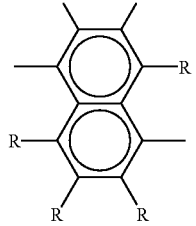
7
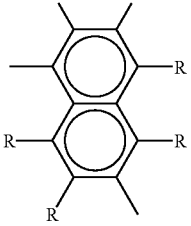
8
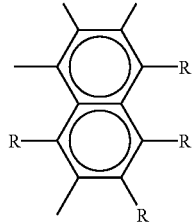
9
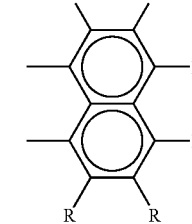
10
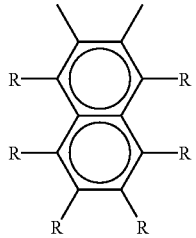
11
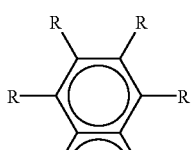
12
-continued
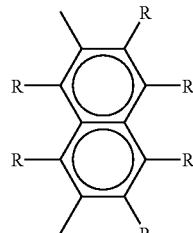
13
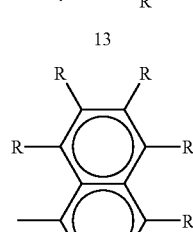
14
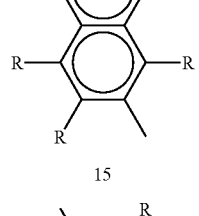
15
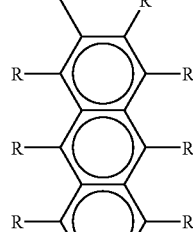
16
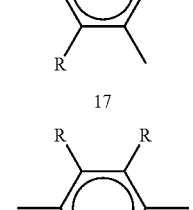
17
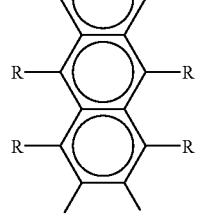
18
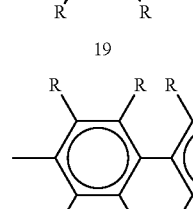
19
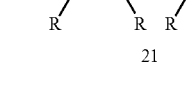
20
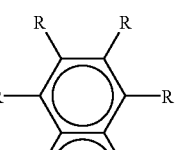
21

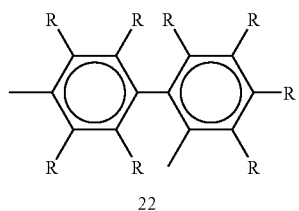
22
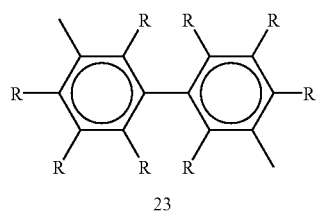
23
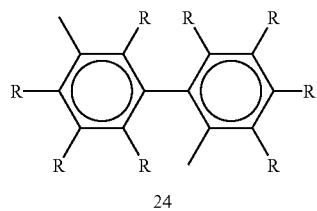
24
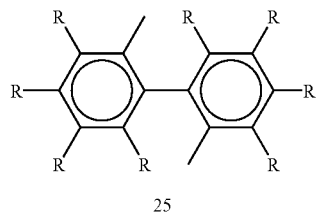
25
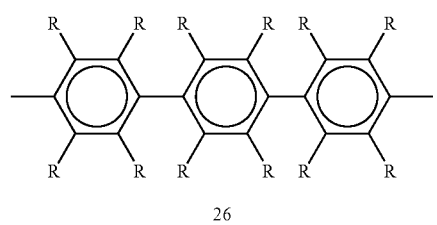
26
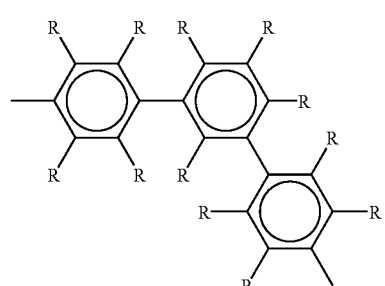
27
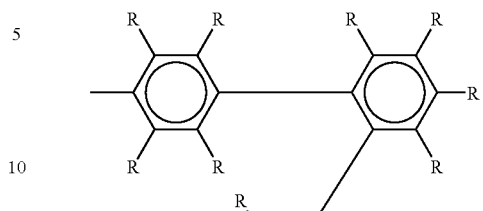
28
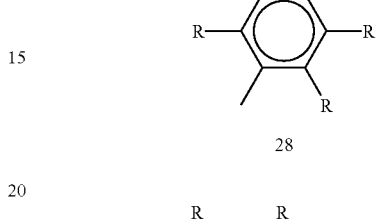
29
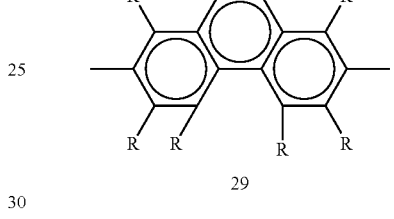
30
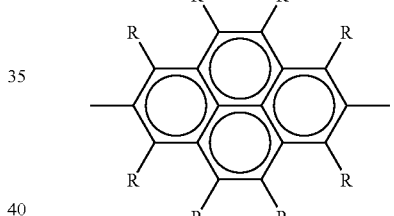
31
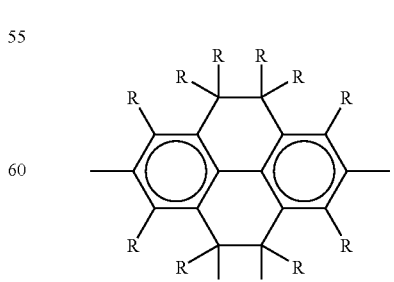
32

-continued

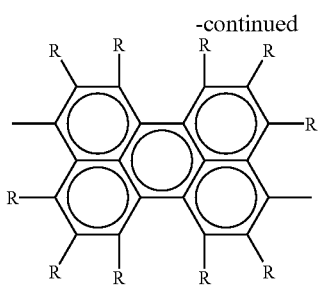

33

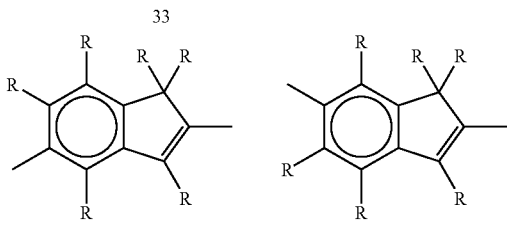

34　　　35

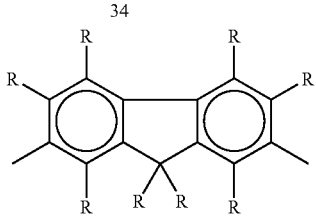

36

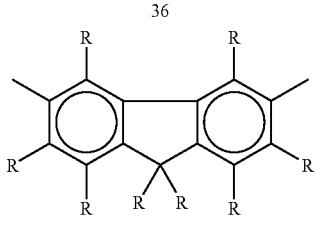

37

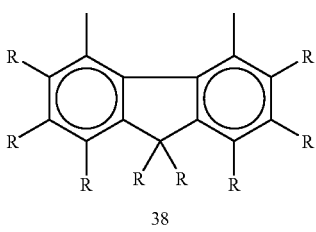

38

In the present invention, the divalent heterocyclic compound group means an atomic group of a heterocyclic compound in which two hydrogen atoms are removed, and has usually about 2 to 60 carbon atoms. The number of carbon atoms of the substituent is not counted as the number of carbon atoms.

The heterocyclic compound means an organic compound having a cyclic structure in which at least one heteroatom such as oxygen, sulfur, nitrogen, phosphorus, boron, arsenic, silicon, selenium, etc. is contained in the cyclic structure as the element other than carbon atoms.

Examples of the divalent heterocyclic compound group include:

groups containing nitrogen as a hetero atom, such as pyridine-diyl group (following formulas 39-44), diazaphenylene group (following formulas 45-48), quinolinediyl group (following formulas 49-63), quinoxalinediyl group (following formulas 64-68), acridinediyl group (following formulas 69-72), bipyridyldiyl group (following formulas 73-75), phenanthroline diyl group (following formulas 76-78), etc;

groups containing silicon, nitrogen, sulfur, selenium, as a hetero atom, and having fluorene structure (following formulas 79-93);

5 membered ring heterocyclic compound groups containing silicon, nitrogen, oxygen, sulfur, selenium, as a hetero atom (following formulas 94-98);

condensed 5 membered ring heterocyclic compound groups containing silicon, nitrogen, oxygen, sulfur, selenium, as a hetero atom (following formulas 99-108);

groups in which 5 membered ring heterocyclic compound groups containing silicon, nitrogen, oxygen, sulfur, selenium, as a hetero atom are connected at the α position of the hetero atom to form a dimer or an oligomer (following formulas 109-110); and groups in which 5 membered ring heterocyclic compound group containing silicon, nitrogen, oxygen, sulfur, selenium, as a hetero atom is connected with a phenyl group at the a position of the hetero atom (following formulas 111-117).

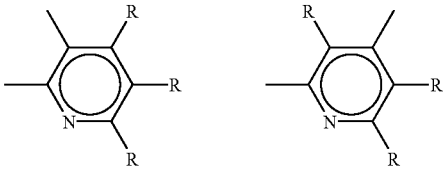

39　　　40

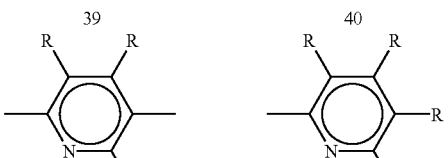

41　　　42

43　　　44

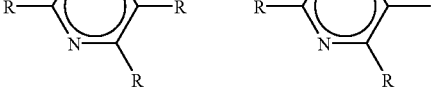

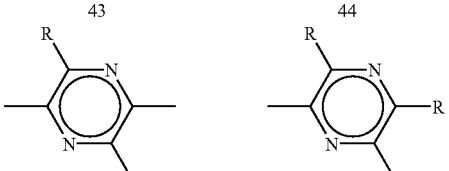

45　　　46

47　　　48

-continued
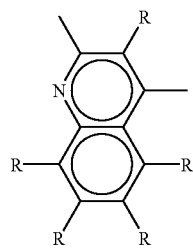
49
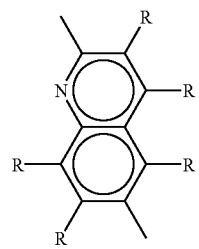
50
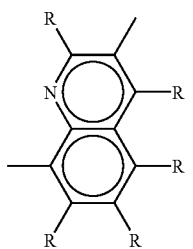
59
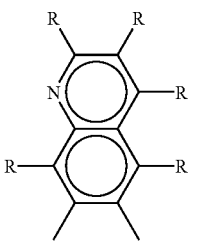
60
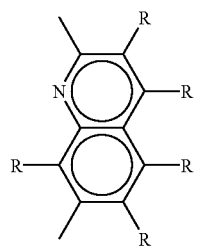
51
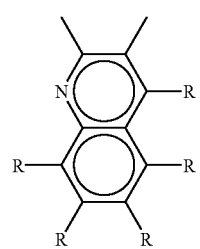
52
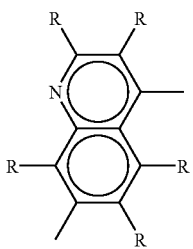
61
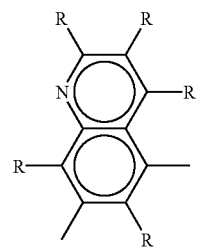
62
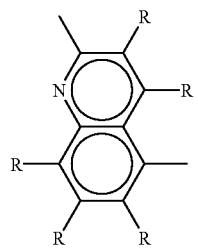
53
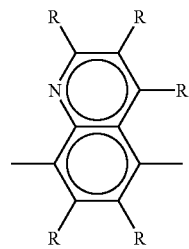
54
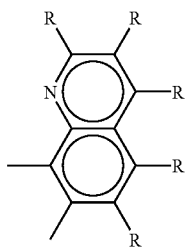
63
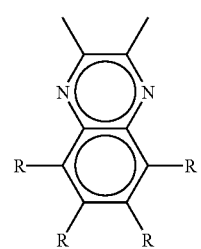
64
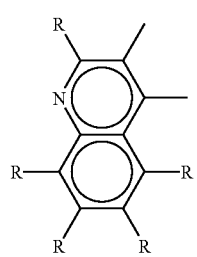
55
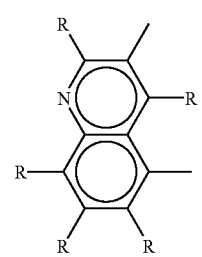
56
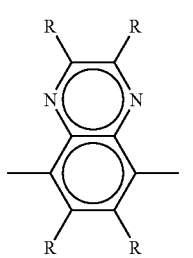
65
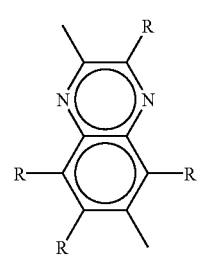
66
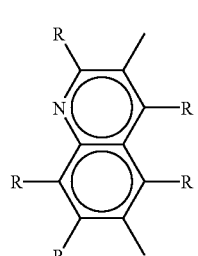
57
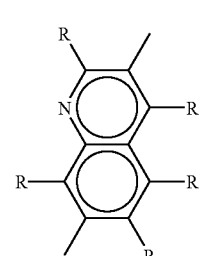
58
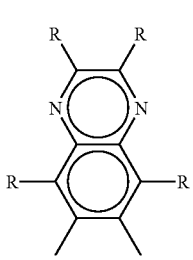
67
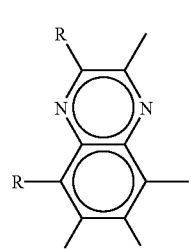
68

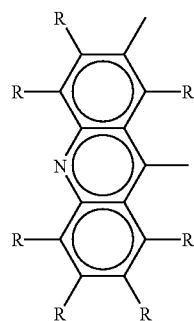
69
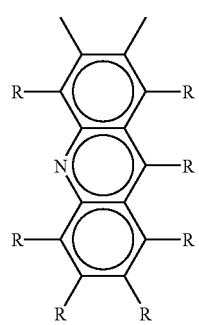
70
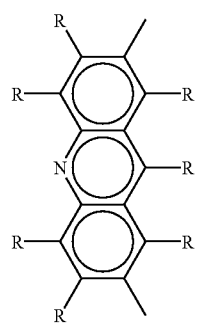
71
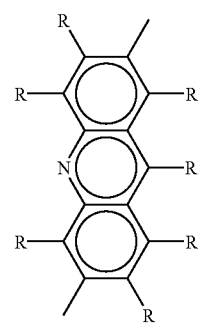
72
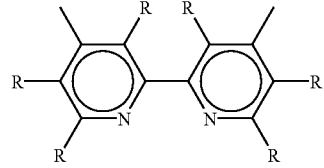
73
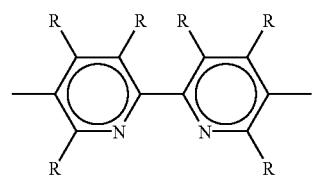
74
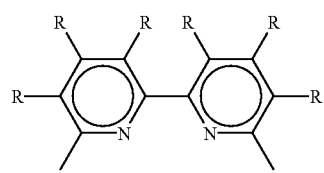
75
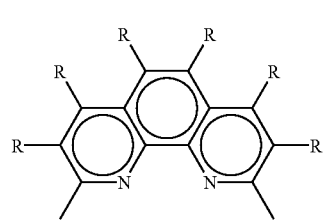
76
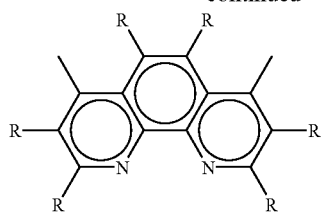
77
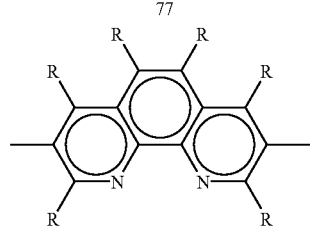
78
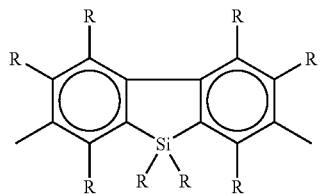
79
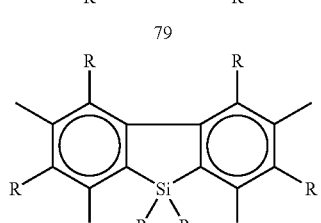
80
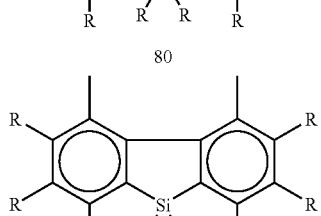
81
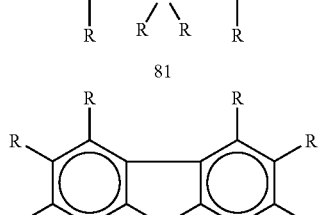
82
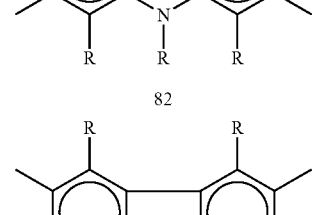
83

-continued
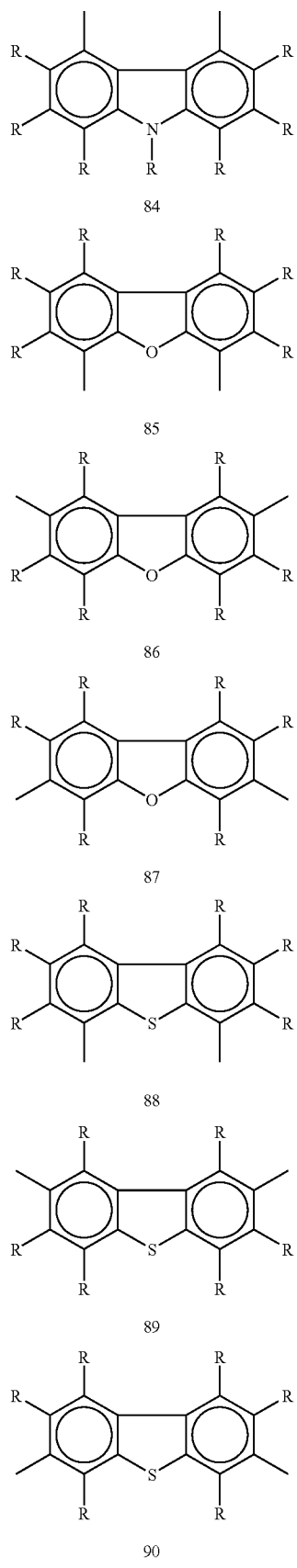
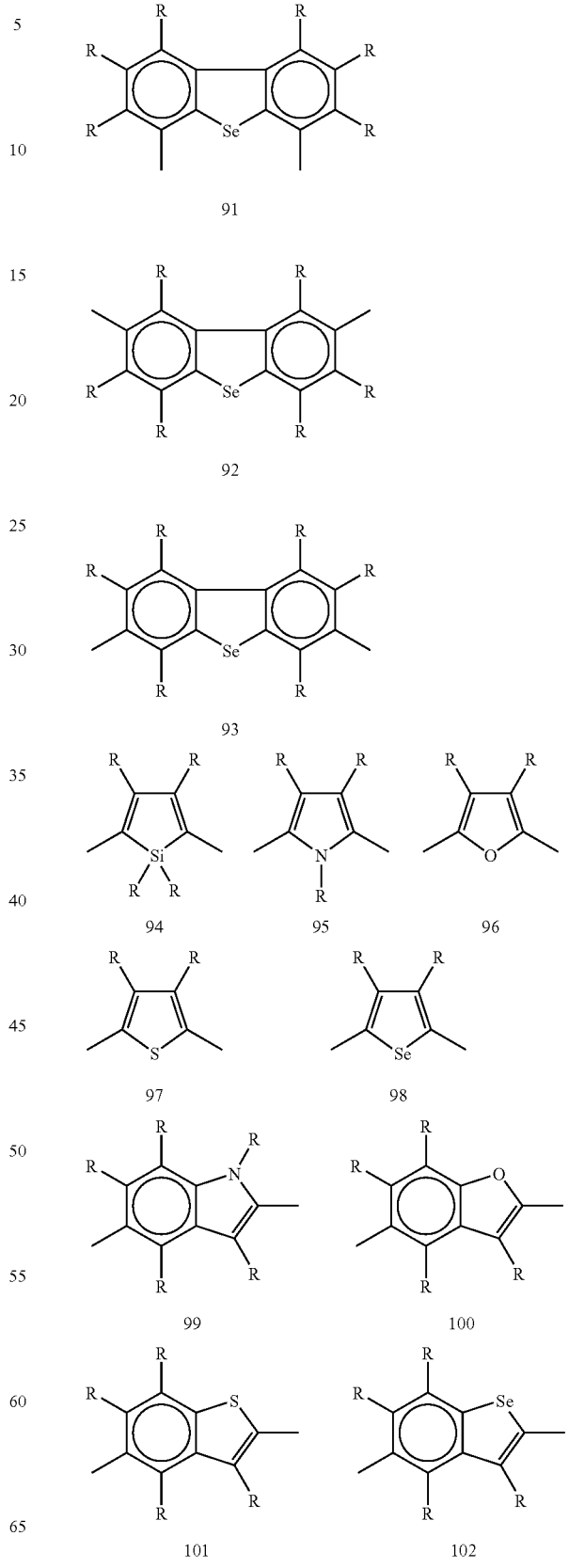

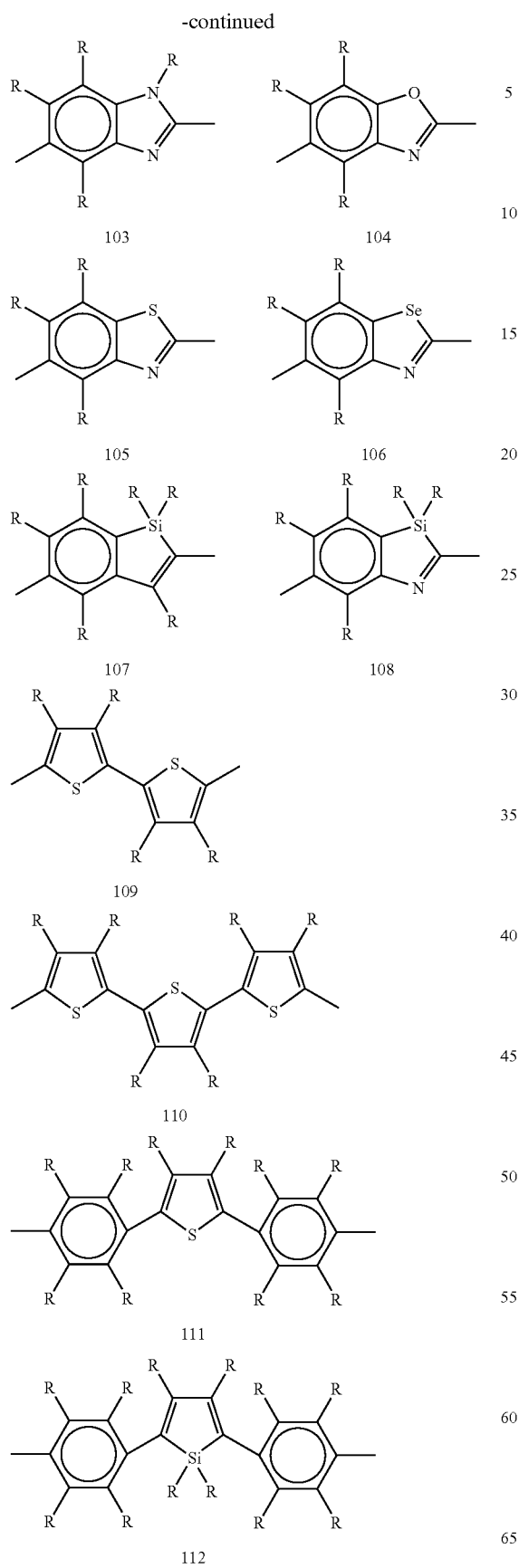
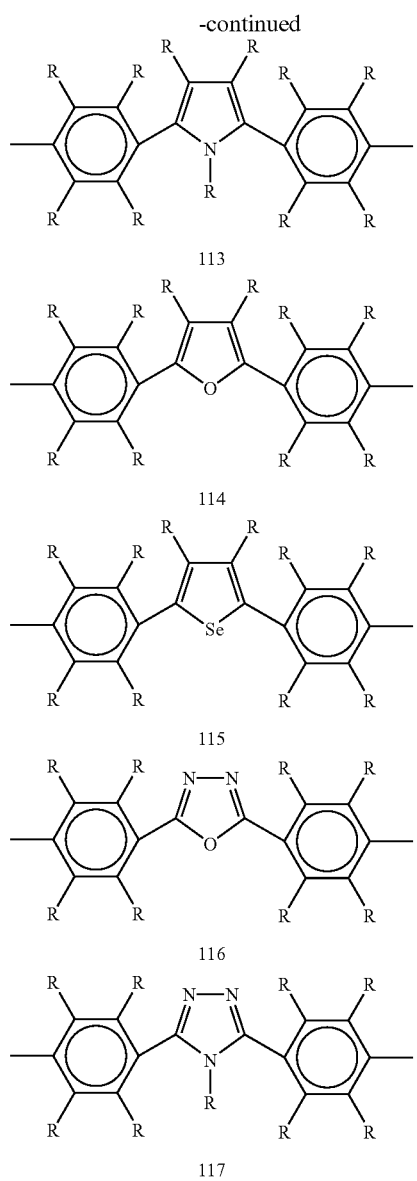

In the above formulas as the examples of arylene group and divalent heterocyclic compound group, R each independently represent a group selected from a hydrogen atom, alkyl group, alkoxy group, alkylthio group, alkylsilyl group, alkylamino group, aryl group, aryloxy group, arylalkyl group, arylalkoxy group, arylalkenyl group, arylalkynyl group, arylamino group, heterocyclic compound group, and cyano group. In order to obtain a material of strong fluorescence, it is suitable that there is little symmetry in the form of the repeating unit including substituent.

The alkyl group may be linear, branched or cyclic. The number of carbon atoms is usually about 1 to 20. Concretely, exemplified are methyl group, ethyl group, propyl group, i-propyl group, butyl group, i-butyl group, t-butyl group, pentyl group, hexyl group, cyclohexyl group, heptyl group, octyl group, 2 -ethylhexyl group, nonyl group, decyl group, 3,7 -dimethyl octyl group, lauryl group, etc., andpentyl group, hexyl group, octyl group, 2-ethylhexyl group, decyl group, 3,7-dimethyl octyl group are preferable.

The alkoxy group may be linear, branched or cyclic. The number of carbon atoms is usually about 1 to 20. Concretely, exemplified are methoxy group, ethoxy group, propyloxy group, i-propyloxy group, butoxy group, i-butoxy group, t-butoxy group, pentyloxy group, hexyloxy group, cyclohexyl oxy group, heptyloxy group, octyloxy group, 2-ethylhexyloxy group, nonyloxy group, decyloxy group, 3,7-dimethyloctyloxy group, lauryloxy group, etc., and pentyloxy group, hexyloxy group, octyloxy group, 2-ethyl hexyloxy group, decyloxy group, 3,7-dimethyloctyloxy group are preferable.

The alkylthio group may be linear, branched or cyclic. The number of carbon atoms is usually about 1 to 20. Concretely, exemplified are methylthio group, ethylthio group, propylthio group, i-propylthio group, butylthio group, i-butylthio group, t-butylthio group, pentylthio group, hexylthio group, cyclo hexylthio group, heptylthio group, octylthio group, 2-ethyl hexylthio group, nonylthio group, decylthio group, 3,7 -dimethyl octylthio group, laurylthio group, etc., and pentylthio group, hexylthio group, octylthio group, 2-ethylhexylthio group, decylthio group, 3,7-dimethyl octylthio group is preferable.

The alkylsilyl group may be linear, branched or cyclic. The number of carbon atoms is usually about 1 to 60. Concretely, exemplified are methylsilyl group, ethylsilyl group, propylsilyl group, i-propylsilyl group, butylsilyl group, i-butylsilyl group, t-butylsilyl group, pentylsilyl group, hexylsilyl group, cyclohexylsilyl group, heptylsilyl group, octylsilyl group, 2-ethylhexylsilyl group, nonylsilyl group, decylsilyl group, 3,7-dimethyloctylsilyl group, laurylsilyl group, trimethyl silylgroup, ethyldimethylsilyl group, propyldimethylsilyl group, i-propyldimethylsilyl group, butyldimethylsilyl group, t-butyldimethylsilyl group, pentyldimethylsilyl group, hexyldimethylsilyl group, heptyldimethylsilyl group, octyldimethylsilyl group, 2-ethylhexyl-dimethylsilyl group, nonyldimethylsilyl group, decyldimethylsilyl group, 3,7-dimethyloctyl-dimethylsilyl group, lauryldimethylsilyl group, etc., and pentylsilyl group, hexylsilyl group, octylsilyl group, 2-ethylhexylsilyl group, decylsilyl group, 3,7-dimethyl octylsilyl group, pentyldimethylsilyl group, hexyldimethylsilyl group, octyldimethylsilyl group, 2-ethylhexyl-dimethylsilyl group, decyldimethylsilyl group, 3,7-dimethyloctyl-dimethylsilyl group is preferable.

The alkylamino group may be linear, branched or cyclic, and may be a monoalkyl amino group or dialkyl amino group. The number of carbon atoms is usually about 1 to 40. Concretely, exemplified are methylamino group, dimethylamino group, ethylamino group, diethylamino group, propylamino group, i-propylamino group, butylamino group, i-butylamino group, t-butylamino group, pentylamino group, hexylamino group, cyclohexylamino group, heptylamino group, octylamino group, 2-ethylhexylamino group, nonylamino group, decylamino group, 3,7-dimethyloctylamino group, laurylamino group, etc., and pentylamino group, hexylamino group, octylamino group, 2-ethylhexylamino group, decylamino group, 3,7-dimethyloctylamino group are preferable.

The aryl group has usually about 6 to 60 carbon atoms. Concretely, exemplified are phenyl group, and $C_1$-$C_{12}$ alkoxyphenyl group ($C_1$-$C_{12}$ means the number of carbon atoms of 1-12), $C_1$-$C_{12}$ alkylphenyl group, 1-naphtyl group, 2-naphtyl group, etc., and $C_1$-$C_{12}$ alkoxyphenyl group, and $C_1$-$C_{12}$ alkyl phenyl group are preferable.

The aryloxy group has usually about 6 to 60 carbon atoms. Concretely, exemplified are phenoxy group, $C_1$-$C_{12}$ alkoxyphenoxy group, $C_1$-$C_{12}$ alkylphenoxy group, 1-naphtyloxy group, 2-naphtyloxy group, etc. $C_1$-$C_{12}$ alkoxyphenoxy group, and $C_1$-$C_{12}$ alkylphenoxy group are preferable.

The arylalkyl group has usually about 7 to 60 carbon atoms. Concretely, exemplified are phenyl-$C_1$-$C_{12}$ alkyl group, $C_1$-$C_{12}$ alkoxyphenyl-$C_1$-$C_{12}$ alkyl group, $C_1$-$C_{12}$ alkylphenyl-$C_1$-$C_{12}$ alkyl group, 1-naphtyl-$C_1$-$C_{12}$ alkyl group, 2-naphtyl-$C_1$-$C_{12}$ alkyl group, etc. $C_1$-$C_{12}$ alkoxyphenyl-$C_1$-$C_{12}$ alkyl group, and $C_1$-$C_{12}$ alkylphenyl-$C_1$-$C_{12}$ alkyl group are preferable.

The arylalkoxy group has usually about 7 to 60 carbon atoms. Concretely, exemplified are phenyl-$C_1$-$C_{12}$ alkoxy group, $C_1$-$C_{12}$ alkoxyphenyl-$C_1$-$C_{12}$ alkoxy group, $C_1$-$C_{12}$ alkylphenyl-$C_1$-$C_{12}$ alkoxy group, 1-naphtyl-$C_1$-$C_{12}$ alkoxy group, 2-naphtyl-$C_1$-$C_{12}$ alkoxy group, etc. $C_1$-$C_{12}$ alkoxy phenyl-$C_1$-$C_{12}$ alkoxy group, and $C_1$-$C_{12}$ alkyl phenyl-$C_1$-$C_{12}$ alkoxy group are preferable.

The arylamino group has usually about 6 to 60 carbon atoms. Concretely, exemplified are phenyl amino group, diphenylamino group, $C_1$-$C_{12}$ alkoxyphenylamino group, di($C_1$-$C_{12}$ alkoxyphenyl) amino group, di($C_1$-$C_{12}$ alkylphenyl)amino group, 1-naphtylamino group, 2-naphtylamino group, etc. $C_1$-$C_{12}$ alkylphenylamino group, and di($C_1$-$C_{12}$ alkylphenyl)amino group are preferable.

The monovalent heterocyclic compound group has usually about 4 to 60 carbon atoms. Concretely, exemplified are thienyl group, $C_1$-$C_{12}$ alkylthienyl group, pyroryl group, furyl group, pyridyl group, $C_1$-$C_{12}$ alkylpyridyl group, etc. Thienyl group, $C_1$-$C_{12}$ alkylthienyl group, pyridyl group, and $C_1$-$C_{12}$ alkyl pyridyl group are preferable.

In the examples of R, substituents containing an alkyl chain may be linear, branched or cyclic one, or the combination thereof. As the alkyl chain not linear, exemplified are isoamyl group, 2 -ethylhexyl group, 3,7 -dimethyloctyl group, cyclohexyl group, 4- $C_1$-$C_{12}$ alkylcyclohexyl group, etc. In order to improve the solubility of a polymeric fluorescent substance in a solvent, it is preferable that one or more of the substituents of $Ar_1$ has cyclic or branched structure.

Moreover, a plurality of Rs may be connected to form a ring. Furthermore, when R contains an alkyl chain, said alkyl chain may be interrupted by a group containing a hetero atom. Here, as the hetero atom, an oxygen atom, a sulfur atom, a nitrogen atom, etc. are exemplified. Examples of the group containing a hetero atom include followings.

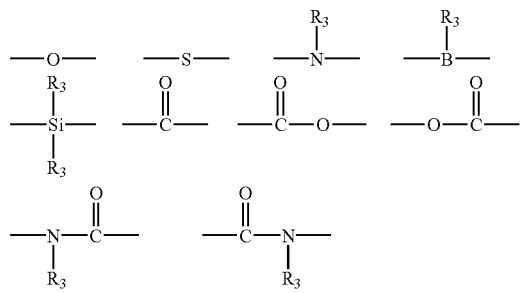

Here, as $R_3$, exemplified are a hydrogen atom, alkyl groups having 1-20 carbon atoms, aryl groups having 6-60 carbon atoms, and monovalent heterocyclic compound groups having 3-60 carbon atoms.

Furthermore, in the examples of R, when an aryl group or a heterocyclic compound group are included in the part of R, the aryl or heterocyclic compound group may have one or more substituents.

In the above formula (1), $Ar_3$ is an aryl group or a monovalent heterocyclic compound group, and has one or more substituent represented by the above formula (2) as nuclear substitution. The aryl group has usually about 6 to 60 carbon atoms. Exemplified are phenyl group, naphtyl group, anthracenyl group, biphenyl group, tripehnyl group, pyrenyl group, fluorenyl group, etc. Among them, phenyl group, biphenyl group, and fluorenyl group are preferable. Said $Ar_3$ may have a substituent. As the substituent, exemplified are alkyl group, alkoxy group, alkythio group, alkylsilyl group, alkylamino group, aryl group, aryloxy group, arylalkyl group, arylalkoxy group, arylalkenyl group, arylallcynyl group, arylamino group, monovalent heterocyclic compound group, etc.

The monovalent heterocyclic compound group is an atomic group of a heterocyclic compound in which one hydrogen atom is removed, and has usually about 2 to 60 carbon atoms.

Examples of the monovalent heterocyclic compound group include: groups containing nitrogen as a hetero atom, such as pyridinyl group, diazapehnyl group, quinolinyl group, quinoxalinyl group, acridinyl group, bipyridynyl group, phenanthroline-yl group, etc.;

groups containing silicon, nitrogen, oxygen, sulfur, selenium, as a hetero atom, and having fluorene structure (groups having a ring structure of the above formulas 79-93);

5 membered ring heterocyclic compound groups containing silicon, nitrogen, oxygen, sulfur, selenium, as a hetero atom (the above formulas 94-98);

condensed 5 membered ring heterocyclic compound groups containing silicon, nitrogen, oxygen, sulfur, selenium, as a hetero atom (groups having a ring structure of the above formulas 99-108);

groups in which 5 membered ring heterocyclic compound groups containing silicon, nitrogen, oxygen, sulfur, selenium, as a hetero atom are connected at the a position of the hetero atom to form a dimer or an oligomer (groups having a ring structure of the above formulas 109-110); and groups in which 5 membered ring heterocyclic compound group containing silicon, nitrogen, oxygen, sulfur, selenium, as a hetero atom is connected with a phenyl group at the a position of the hetero atom (groups having a ring structure of the above formulas 111-117).

In the formula (1) of the present invention, X represents $-CR_1=CR_2-$ or $-C\equiv C-$. and $-CR_1=CR_2$ is preferable in view of stability. The symbol of n is 0 or 1, and 0 is preferable in view of optical stability.

Here, $R_1$ and $R_2$ each independently represent a group selected from a hydrogen atom, alkyl group, aryl group, monovalent heterocyclic compound group, and cyano group.

The repeating unit represented by formula (1) has at least one substituent represented by the above formula (2).

In the repeating unit represented by formula (2), $Ar_4$ is an aryl group, a monovalent heterocyclic compound group or a monovalent aromatic amine group. As a concrete example of the aryl group and the monovalent heterocyclic compound group, the same groups as those of $Ar_3$ are exemplified.

The monovalent aromatic amine group is an atomic group of an aromatic amine in which a hydrogen atom is removed, and has usually about 4 to 60 carbon atoms. The number of carbon atoms of the substituent is not counted as the number of carbon atoms. Examples of the monovalent aromatic amine group include the followings represented by formulae 123-127.

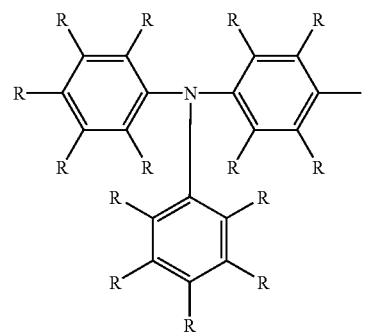

123

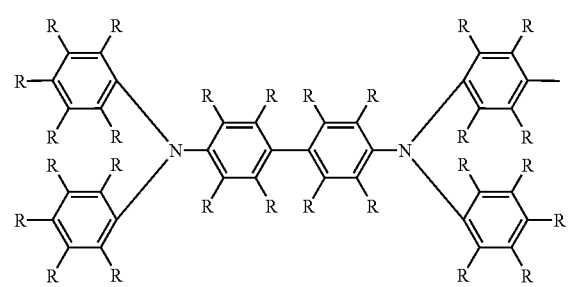

124

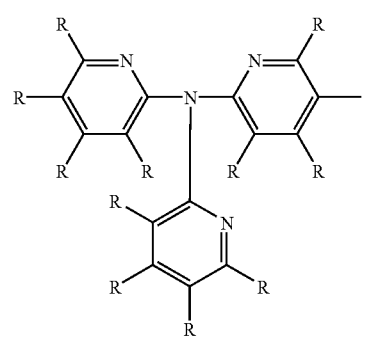

125

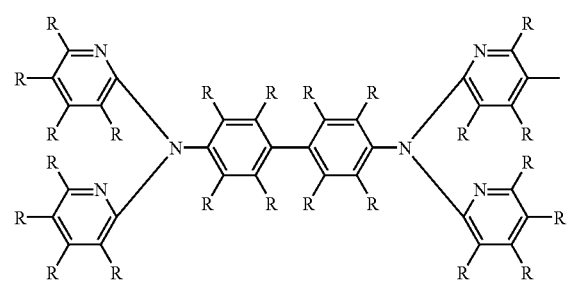

126

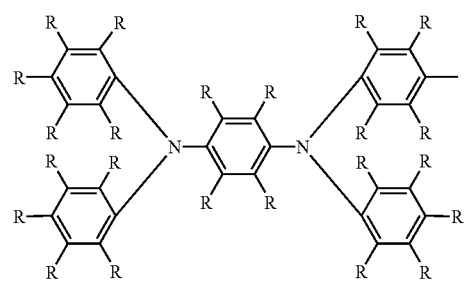

127

In formulae 123 to 127, R means the same as above.
As the repeating unit represented by formula (2), the followings are exemplified concretely.
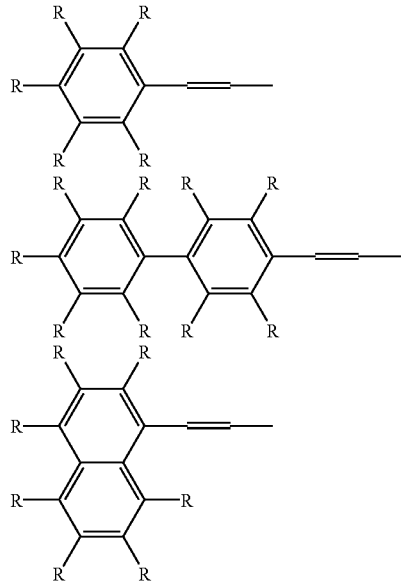
Among them
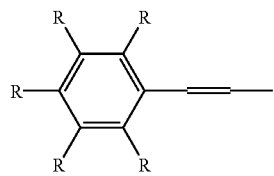
is preferable.
As the repeating unit represented by formula (1), the followings are exemplified concretely.
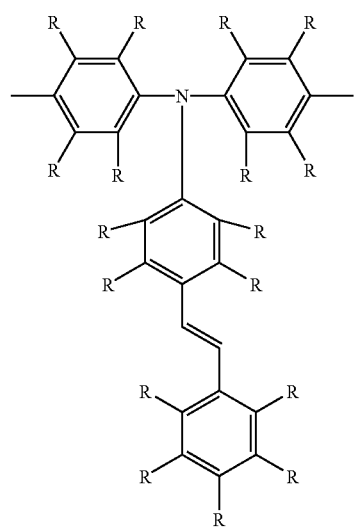
-continued
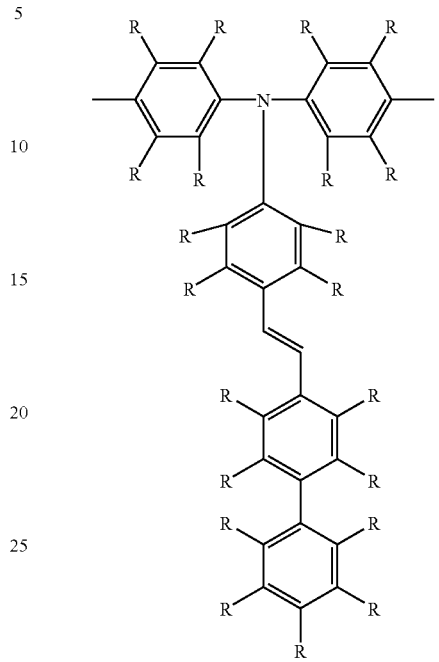
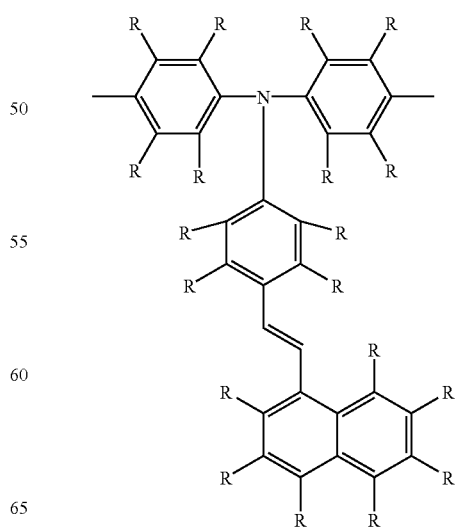

Among them,

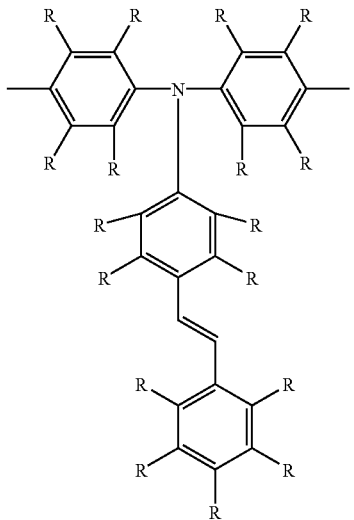

is preferable

The polymeric fluorescent substance of the present invention, preferably contains one or more repeating units represented by the above formula (1) and one or more repeating units represented by the following formula (3).

$$-Ar_5-(Z)p- \quad (3)$$

$Ar_5$ is an arylene group or a divalent heterocyclic compound group. The symbol Z represents $-CR_5=CR_6-$ or $-C\equiv C-$. $R_5$ and $R_6$ each independently represents a group selected from a hydrogen atom, alkyl group, aryl group, monovalent heterocyclic compound group, and cyano group. The symbol p is 0 or 1.

In view of thermal stability, it is preferable that the total amount of the repeating unit represented by formula (1) and formula (3) is 50% by mole or more based on all repeating units; and at the same time, the repeating unit represented by a formula (1) is 2% by mole or more and 90% by mole or less, and the repeating unit represented by formula (3) is 10% by mole or more and 98% by mole or less based on the total amount of the repeating unit represented by formulas (1) and (3).

In the repeating unit represented by formula (3), $Ar_5$ is an arylene group or a divalent heterocyclic compound group. The same groups with those as $Ar_1$ are exemplified as $Ar_5$.

Z represents $-CR_5=CR_6-$ or $-C\equiv C-$. $R_5$ and $R_6$ each independently represent a group selected from a hydrogen atom, alkyl group, aryl group, monovalent heterocyclic compound group, and cyano group. The symbol p is 0 or 1.

As the repeating unit represented by formula (3), those having a structure described in the above formulas 1 to 117, and the following formulas A to F are exemplified concretely. Among them, phenylene group (for example, above formulas 1-3), naphthalenediyl group (above formulas 4-13), anthracenylene group (above formulas 14-19), biphenylene group (above formulas 20-25), triphenylene group (above formulas 26-28), condensed ring compound group (above formulas 29-38), stilbene-diyl group (following formula A to D), distilbene-diyl group (following formula E and F), etc. are exemplified preferably. Among them, phenylene group, biphenylene group, fluorene-diyl group (above formulas 36-38), stilbene-diyl group and distilbene-diyl group are especially preferable.

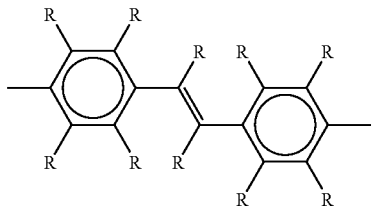

A

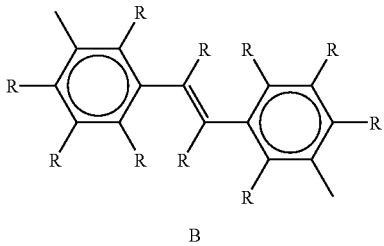

B

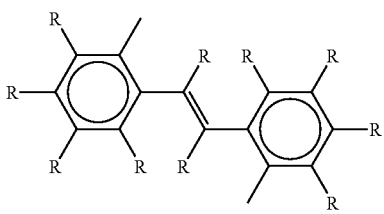

C

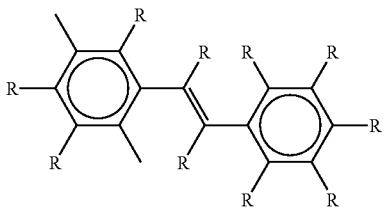

D

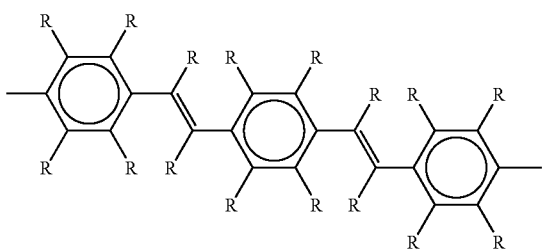

E

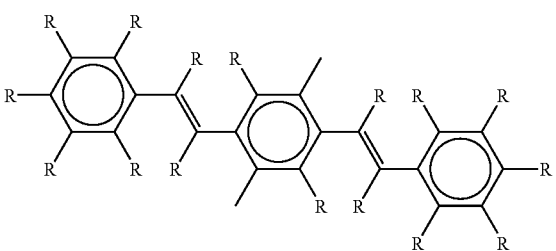

F

In the polymeric fluorescent substance containing one or more repeating units represented by formula (1) and formula (3), respectively, following combinations of the repeating units of formulas (1) and (3) are exemplified as a structural unit of alternating copolymer.

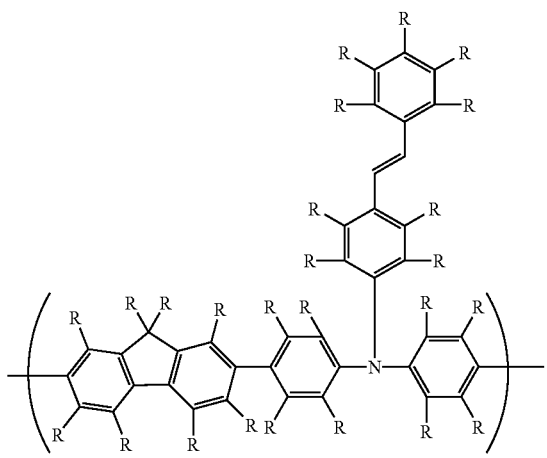

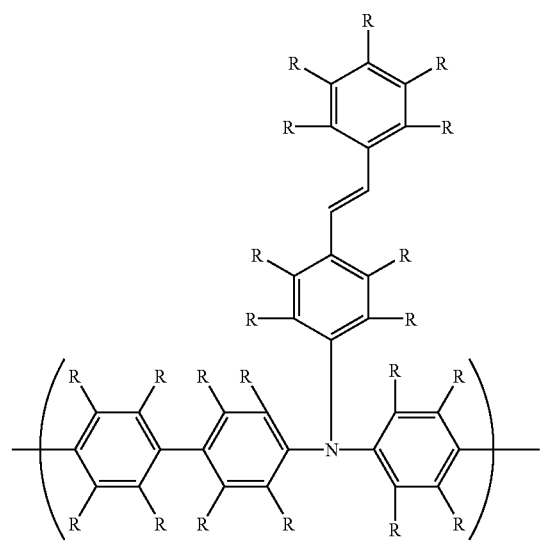

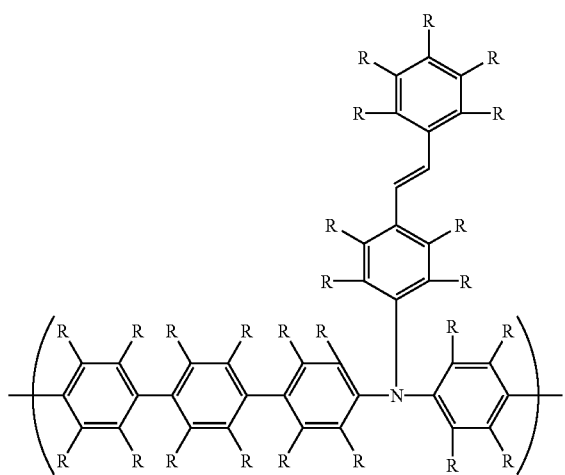

Among them,

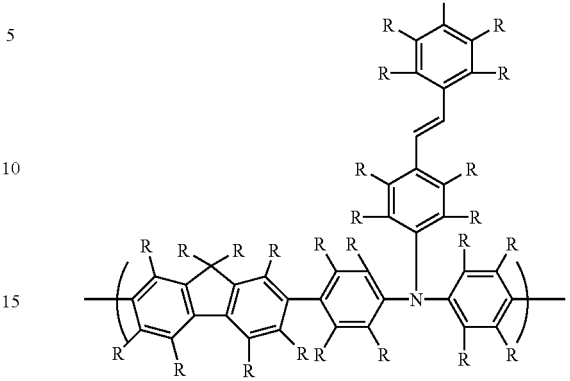

is preferable.

The polymeric fluorescent substance of the present invention exhibits fluorescence in the solid state, and typically, has a polystyrene reduced number average molecular weight of $10^3$ to $10^8$, and preferably $2 \times 10^3$ to $10^7$.

Furthermore, the end group of a polymeric fluorescent substance may also be protected with a stable group since if a polymerization active group remains intact, there is a possibility of reduction in light emitting property and lifetime when the fluorescent substance is made into an device. Those having a conjugated bond continuing to a conjugated structure of the main chain are preferable, and there are exemplified structures connected to an aryl group or heterocyclic compound group via a carbon-carbon bond. Specifically, substituents of the chemical formula 10 in JP-A No. 9-45478 are exemplified.

Furthermore, the polymeric fluorescent substance may contain a repeating unit other than repeating units represented by the formula (1), in an amount which does not deteriorate fluorescent property and charge transporting property. Further, repeating units represented by the formula (1) and other repeating units may be connected with a non-conjugation unit, or such a non-conjugation part may be contained in the repeating unit. As the bonding structure, there are exemplified those illustrated below, those obtained by combining those illustrated below with a vinylene group, those obtained by combining two or more of those illustrated below, and the like. Here, R represents the same groups as above, and Ar represents a hydrocarbon group having 6 to 60 carbon atoms.

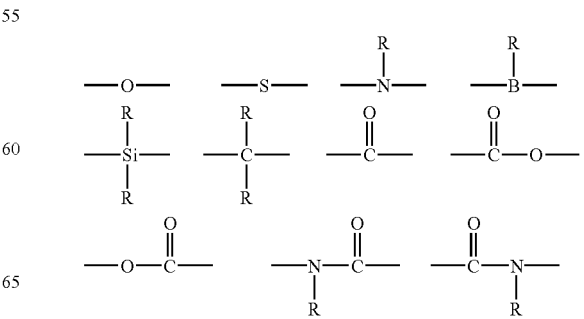

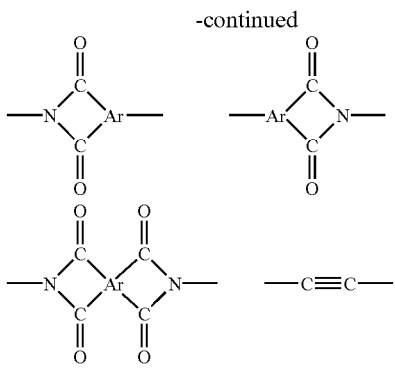

Said polymeric fluorescent substance may also be a random, block or graft copolymer, or a polymer having an intermediate structure thereof, for example, a random copolymer having blocking property. From the viewpoint for obtaining a polymeric fluorescent substance having high fluorescent quantum yield, random copolymers having blocking property and block or graft copolymers are more preferable than complete random copolymers. Further, copolymers may have branched main chain and more than three terminals.

Further, a polymeric fluorescent substance exhibiting fluorescence in the solid state is suitably used, since light emission from a thin film is utilized.

As good solvents for the polymeric fluorescent substance, there are exemplified chloroform, methylene chloride, dichloroethane, tetrahydrofuran, toluene, xylene, mesitylene, tetralin, decalin, n-butylbenzene, dioxane, and the like. The polymeric fluorescent substance can be usually dissolved in these solvents in an amount of 0.1 wt % or more, though the amount differs depending on the structure and molecular weight of the polymeric fluorescent substance.

When these polymeric fluorescent substances are used as a light emitting material of a polymer LED, the purity thereof exerts an influence on light emitting property, therefore, it is preferable that a monomer before polymerization is purified by a method such as distillation, sublimation purification, re-crystallization and the like before being polymerized and further, it is preferable to conduct a purification treatment such as re-precipitation purification, chromatographic separation and the like after the synthesis.

The polymeric fluorescent substance of the present invention can be used not only as a light emitting material, but also as an organic semiconductor material, optical material, or as conductive material by doping.

A method of producing a polymeric fluorescent substance of the present invention will be described below.

As the method of producing a polymeric fluorescent substance of the present invention, for example, a method described in JP-A No. 5-202355 is mentioned, when a vinylene group is contained in the main chain. Namely, there are exemplified methods such as polymerization of a compound having an aldehyde group with a compound having a phosphonium salt group, or of a compound having an aldehyde group and a phosphonium salt group, according to a Wittig reaction, polymerization of a compound having a vinyl group with a compound having a halogen group, or of a compound having a vinyl group and a halogen group, according to a Heck reaction, polymerization of a compound having an aldehyde group with a compound having an alkylphosphonate group, or of a compound having an aldehyde group and an alkylphosphonate group, according to a Horner-Wadsworth-Emmons reaction, polycondensation of a compound having two or more halogenated methyl groups, according to a de-hydrohalogenating method, polycondensation of a compound having two or more sulfonium salt groups, according to a sulfonium salt-decomposing method, polymerization of a compound having an aldehyde group with a compound having an acetonitrile group, or of a compound having an aldehyde group and an acetonitrile group, according to a Knoevenagel reaction, polymerization of a compound having two or more aldehyde groups, according to McMurry reaction, and the like.

When a vinylene group is not contained in the main chain, for example, a method of polymerization from corresponding monomers by a Suzuki coupling reaction, a method of polymerization by a Grignard reaction, a method of polymerization using a Ni(0) catalyst, a method of polymerization using an oxidizer such as $FeCl_3$ and the like, a method of oxidation polymerization electrochemically, a method of decomposition of an intermediate polymer having a suitable releasing group, and the like are exemplified.

Of these, the polymerization method by a Wittig reaction, the polymerization method by a Heck reaction, the polymerization method by a Horner-Wadsworth-Emmons method, the polymerization method by a Knoevenagel reaction, the polymerization method by a Suzuki coupling reaction, the polymerization method by a Grignard reaction and the polymerization method using a Ni(0) catalyst are preferable since structure control is easy in these methods.

Specifically, a compound used as a monomer, having a plurality of reactive substituents is dissolved, if necessary, in an organic solvent, and can be reacted at the melting temperature or more and the boiling point or less of the organic solvent using an alkali or suitable catalyst, for example. For example, known methods can be used, described in "Organic Reactions", vol. 14, pp. 270 to 490, John Wiley & Sons, Inc., 1965, "Organic Reactions", vol. 27, pp. 345 to 390, John Wiley & Sons, Inc., 1982, "Organic Synthesis", Collective Volume VI, pp. 407 to 411, John Wiley & Sons, Inc., 1988, Chemical Review, vol. 95, p. 2457 (1995), Journal of Organometallic Chemistry, vol. 576, p. 147 (1999), Journal of Praktical Chemistry, vol. 336, p. 247 (1994), Makromolecular Chemistry Macromolecular Symposium, vol. 12, p. 229 (1987), and the like.

It is preferable that the organic solvent used is subjected to a deoxygenation treatment sufficiently and the reaction is progressed under an inert atmosphere, generally for suppressing a side reaction, though the treatment differs depending on compounds and reactions used. Further, it is preferable to conduct a dehydration treatment likewise (however, this is not applicable in the case of a reaction in a two-phase system with water, such as a Suzuki coupling reaction).

For the reaction, an alkali or suitable catalyst is added appropriately. These may be selected according to the reaction used. It is preferable that the alkali or catalyst is soluble sufficiently in a solvent used for the reaction. As the method of mixing an alkali or catalyst, there is exemplified a method of adding a solution of an alkali or catalyst slowly while stirring under an inner atmosphere of argon and nitrogen and the like or a method of slowly adding the reaction solution to a solution of an alkali or catalyst, inversely.

More specifically, regarding the reaction conditions, in the cases of a Wittig reaction, Horner reaction, Knoevengel reaction and the like, an alkali in an amount of equivalent or more, preferably from 1 to 3 equivalent of based on the amount of functional groups of monomers is used and reacted. The alkali is not particularly restricted, and for example, metal alkolates such as potassium-t-butoxide, sodium-t-butoxide, sodium ethylate, lithium methylate and the like, hydride reagents such as sodium hydride and the like, amides such as sodiumamide and the like can be used. As the solvent, N,N-dimethylformamide, tetrahydrofuran, dioxane, toluene and the like are used. The reaction can be progressed at a reaction temperature of usually from room temperature to about 150° C. The reaction time is, for example, from 5 minutes to 40 hours, and time for sufficient progress of polymerization may be permissible, and since there is no necessity of leaving for a long period of time after completion of the reaction, the reaction time is preferably from 10 minutes to 24 hours. The concentration in the reaction may advantageously be selected appropriately within the range from about 0.01 wt % to the maximum solution concentration since when the concentration is too low, the reaction efficiency is poor and when too high, the reaction control is difficult, and the usual range is from 0.1 wt % to 20 wt %. In the case of a Heck reaction, monomers are reacted in the presence of a base such as triethylamine and the like, using a palladium catalayst. The reaction is effected at a reaction temperature of from about 80 to 160° C. for a reaction time of about 1 to 100 hours, using a solvent having relatively high boiling point such as N,N-dimethyl-formamide, N-methylpyrrolidone and the like.

In the case of a Suzuki coupling reaction, palladium [tetrakis(triphenylphosphine)], palladium acetates and the like are used, for example, as a catalyst, and an inorganic base such as potassium carbonate, sodium carbonate, barium hydroxide and the like, an organic base such as triethylamine and the like, and an inorganic salt such as cesium fluoride and the like, are added preferably in equivalent amount, preferably in an amount of 1 to 10 equivalent based on monomers, and reacted. It may be also permissible that an inorganic salt is used as an aqueous solution and reacted in a two-phase system. As the solvent, N,N-dimethylforma-mide, toluene, dimethoxyethane, tetrahydrofuran and the like are exemplified. Depending on the solvent, temperatures of 50 to 160° C. are preferably used. It may also be permissible that the temperature is raised near the boiling point of a solvent, to cause reflux. The reaction time is from about 1 to 200 hours.

In the case of a Grignard reaction, exemplified is a method in which a halide and metal Mg are reacted in an ether-based solvent such as tetrahydrofuran, diethyl ether, dimethoxy-ethane and the like to prepare a Grignard reagent which is mixed with a separately prepared monomer solution, and a nickel or palladium catalyst is added while paying attention to excess reaction, then, the reaction temperature is raised to reflux and the reaction is effected. The Grignard reagent is used in the equivalent amount, preferably in an amount of from 1 to 1.5 equivalent, more preferably from 1 to 1.2 equivalent, based on monomers. Also in the case of poly-merization by other methods than those described above, the reaction can be effected by known methods.

As the case of using a zero-valent nickel complex, exem-plified is a method of reacting a halide with using a zero-valent nickel complex in N,N-dimethylformamide; N,N-dimethylacetamide; an ether solvent such as tetrahydrofuran, 1,4-dioxane, etc.; or in an aromatic hydro-carbon solvent such as toluene, etc. As the zero-valent nickel complex, exemplified are bis(1,5-cyclooctadiene)nickel(0), (ethylene)bis(triphenylphosphine)nickel(0), tetrakis(triph-enylphosphine)nickel, etc., and bis (1,5-cyclooctadiene) nickel(0) is preferable.

In this case, in view of improvement of the yield, and polymerization into high molecular weight, it is preferable to add a neutral ligand.

Here, the neutral ligand is a ligand having neither anion nor cation. Exemplified are nitrogen-containing ligands, such as 2,2'-bipyridyl, 1,10-phenanthroline, methylenebi-soxazoline, N,N'-tetramethylethylenediamine; and tertiary phosphine ligands, such as triphenyl phosphine, tri-tolylphosphine, tributylphosphine, and triphenoxyphos-phine. Nitrogen-containing ligands are suitable in view of flexibility and cheapness. 2,2'-bipyridyl is especially suit-able in view of high reactivity and high yield.

Especially, in view of polymerization into high molecular weight, preferable is a system in which 2,2'-bipyridyl is added as a neutral ligand to a system containing bis(1,5-cyclooctadiene)nickel(0).

The amount of the zero-valent nickel complex is not limited especially, unless it inhibits the polymerization reac-tion. When the amount is too small, polymerization reaction time will become long, and when too much, treatment after polymerization will become difficult. Accordingly, the amount is 0.1 or more, preferably 1 mol or more based on one mole of monomers. When the amount too little, the molecular weight tends to be small. The upper limit is not limited especially, but when the amount is too much, treat-ment after polymerization may become difficult, and the amount is preferably 5.0 mol or less.

When a neutral ligand is used, the amount is usually about 0.5 to 10 mols based on 1 mol of zero-valent nickel complex. In view of cost performance (high yield and cheap amount of addition), it is preferably is about 0.9 to 1.1 mol. When other polymerizing methods are adopted, the reaction can be conducted according to a known method.

When using the polymeric fluorescent substance of the present invention as a light-emitting material of polymer LED, the purity affects luminescence characteristics. For this reason, in the manufacture method of the present invention, the above-mentioned separation operation and purification operation are performed sufficiently enough. It is preferable to remove an unreacted monomer, a by-prod-uct, catalyst residues, etc., sufficiently.

Drying should just be conducted under the condition where the residual solvents can be removed sufficiently. In order to prevent deterioration of a polymeric fluorescent substance, it is preferable to conduct drying in a condition of light screening and inactive atmosphere. Moreover, it is preferable to conduct drying at a temperature where a polymeric fluorescent substance does not deteriorate ther-mally.

Next, the polymer LED of the present invention will be described. Regarding the structure of the polymer LED of the present invention, a light-emitting layer is present between an anode and a cathode at least one of which is transparent or semi-transparent, and the polymeric fluores-cent substance of the present invention is contained in the light-emitting layer.

As the polymer LED of the present invention, there are listed polymer LEDs having an electron transporting layer disposed between a cathode and a light emitting layer, polymer LEDs having a hole transporting layer disposed between an anode and a light emitting layer, polymer LEDs having an electron transporting layer disposed between a cathode and a light emitting layer and having a hole trans-porting layer disposed between an anode and a light emitting layer.

For example, the following structures a) to d) are specifically exemplified.

a) anode/light emitting layer/cathode
b) anode/hole transporting layer/light emitting layer/cathode
c) anode/light emitting layer/electron transporting layer//cathode
d) anode/hole transporting layer/light emitting layer/electron transporting layer/cathode (wherein, /indicates adjacent lamination of layers. Hereinafter, the same)

Herein, the light emitting layer is a layer having function to emit a light, the hole transporting layer is a layer having function to transport a hole, and the electron transporting layer is a layer having function to transport an electron. Herein, the electron transporting layer and the hole transporting layer are generically called a charge transporting layer.

The light emitting layer, hole transporting layer and electron transporting layer may also each independently used in two or more layers.

Of charge transporting layers disposed adjacent to an electrode, that having function to improve charge injecting efficiency from the electrode and having effect to decrease driving voltage of an device are particularly called sometimes a charge injecting layer (hole injecting layer, electron injecting layer) in general.

For enhancing adherence with an electrode and improving charge injection from an electrode, the above-described charge injecting layer or insulation layer having a thickness of 2 nm or less may also be provided adjacent to an electrode, and further, for enhancing adherence of the interface, preventing mixing and the like, a thin buffer layer may also be inserted into the interface of a charge transporting layer and light emitting layer.

The order and number of layers laminated and the thickness of each layer can be appropriately applied while considering light emitting efficiency and life of the device.

In the present invention, as the polymer LED having a charge injecting layer (electron injecting layer, hole injecting layer) provided, there are listed a polymer LED having a charge injecting layer provided adjacent to a cathode and a polymer LED having a charge injecting layer provided adjacent to an anode.

For example, the following structures e) to p) are specifically exemplified.

e) anode/charge injecting layer/light emitting layer/cathode
f) anode/light emitting layer/charge injecting layer/cathode
g) anode/charge injecting layer/light emitting layer/charge injecting layer/cathode
h) anode/charge injecting layer/hole transporting layer/light emitting layer/cathode
i) anode/hole transporting layer/light emitting layer/charge injecting layer/cathode
j) anode/charge injecting layer/hole transporting layer/light emitting layer/charge injecting layer/cathode
k) anode/charge injecting layer/light emitting layer/electron transporting layer/cathode
l) anode/light emitting layer/electron transporting layer/charge injecting layer/cathode
m) anode/charge injecting layer/light emitting layer/electron transporting layer/charge injecting layer/cathode
n) anode/charge injecting layer/hole transporting layer/light emitting layer/electron transporting layer/cathode
o) anode/hole transporting layer/light emitting layer/electron transporting layer/charge injecting layer/cathode
p) anode/charge injecting layer/hole transporting layer/light emitting layer/electron transporting layer/charge injecting layer/cathode As the specific examples of the charge injecting layer, there are exemplified layers containing an conducting polymer, layers which are disposed between an anode and a hole transporting layer and contain a material having an ionization potential between the ionization potential of an anode material and the ionization potential of a hole transporting material contained in the hole transporting layer, layers which are disposed between a cathode and an electron transporting layer and contain a material having an electron affinity between the electron affinity of a cathode material and the electron affinity of an electron transporting material contained in the electron transporting layer, and the like.

When the above-described charge injecting layer is a layer containing an conducting polymer, the electric conductivity of the conducting polymer is preferably $10^{-5}$ S/cm or more and $10^3$ S/cm or less, and for decreasing the leak current between light emitting pixels, more preferably $10^{-5}$ S/cm or more and $10^2$ S/cm or less, further preferably $10^{-5}$ S/cm or more and $10^1$ S/cm or less.

Usually, to provide an electric conductivity of the conducting polymer of $10^{-5}$ S/cm or more and $10^3$ S/cm or less, a suitable amount of ions are doped into the conducting polymer.

Regarding the kind of an ion doped, an anion is used in a hole injecting layer and a cation is used in an electron injecting layer. As examples of the anion, a polystyrene sulfonate ion, alkylbenzene sulfonate ion, camphor sulfonate ion and the like are exemplified, and as examples of the cation, a lithium ion, sodium ion, potassium ion, tetrabutyl ammonium ion and the like are exemplified.

The thickness of the charge injecting layer is for example, from 1 nm to 100 nm, preferably from 2 nm to 50 nm.

Materials used in the charge injecting layer may properly be selected in view of relation with the materials of electrode and adjacent layers, and there are exemplified conducting polymers such as polyaniline and derivatives thereof, polythiophene and derivatives thereof, polypyrrole and derivatives thereof, poly(phenylene vinylene) and derivatives thereof, poly(thienylene vinylene) and derivatives thereof, polyquinoline and derivatives thereof, polyquinoxaline and derivatives thereof, polymers containing aromatic amine structures in the main chain or the side chain, and the like, and metal phthalocyanine (copper phthalocyanine and the like), carbon and the like.

The insulation layer having a thickness of 2 nm or less has function to make charge injection easy. As the material of the above-described insulation layer, metal fluoride, metal oxide, organic insulation materials and the like are listed. As the polymer LED having an insulation layer having a thickness of 2 nm or less, there are listed polymer LEDs having an insulation layer having a thickness of 2 nm or less provided adjacent to a cathode, and polymer LEDs having an insulation layer having a thickness of 2 nm or less provided adjacent to an anode.

Specifically, there are listed the following structures q) to ab) for example.

q) anode/insulation layer having a thickness of 2 nm or less/light emitting layer/cathode
r) anode/light emitting layer/insulation layer having a thickness of 2 nm or less/cathode
s) anode/insulation layer having a thickness of 2 nm or less/light emitting layer/insulation layer having a thickness of 2 nm or less/cathode t) anode/insulation layer having a thickness of 2 nm or less/hole transporting layer/light emitting layer/cathode u) anode/hole transporting layer/light emitting layer/insulation layer having a thickness of 2 nm or less/cathode v) anode/insulation layer having a thickness of 2 nm or less/hole transporting layer/light emitting layer/insulation layer having a thickness of 2 nm or less/cathode w) anode/insulation layer having a thickness of 2 nm or less/light emitting layer/electron transporting layer/cathode x) anode/light emitting layer/electron transporting layer/insulation layer having a thickness of 2 nm or less/cathode y) anode/insulation layer having a thickness of 2 nm or less/light emitting layer/electron transporting layer/insulation layer having a thickness of 2 nm or less/cathode z) anode/insulation layer having a thickness of 2 nm or less/hole transporting layer/light emitting layer/electron transporting layer/cathode aa) anode/hole transporting layer/light emitting layer/electron transporting layer/insulation layer having a thickness of 2 nm or less/cathode ab) anode/insulation layer having a thickness of 2 nm or less/hole transporting layer/light emitting layer/electron transporting layer/insulation layer having a thickness of 2 nm or less/cathode In producing a polymer LED, when a film is formed from a solution by using such polymeric fluorescent substance soluble in an organic solvent, only required is removal of the solvent by drying after coating of this solution, and even in the case of mixing of a charge transporting material and a light emitting material, the same method can be applied, causing an extreme advantage in production. As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

Regarding the thickness of the light emitting layer, the optimum value differs depending on material used, and may properly be selected so that the driving voltage and the light emitting efficiency become optimum values, and for example, it is from 1 nm to 1 µm, preferably from 2 nm to 500 nm, further preferably from 5 nm to 200 nm.

In the polymer LED of the present invention, light emitting materials other than the above-described polymeric fluorescent substance can also be mixed in a light emitting layer. Further, in the polymer LED of the present invention, the light emitting layer containing light emitting materials other than the above-described polymeric fluorescent substance may also be laminated with a light emitting layer containing the above-described polymeric fluorescent substance.

As the light emitting material, known materials can be used. In a compound having lower molecular weight, there can be used, for example, naphthalene derivatives, anthracene or derivatives thereof, perylene or derivatives thereof; dyes such as polymethine dyes, xanthene dyes, coumarine dyes, cyanine dyes; metal complexes of 8-hydroxyquinoline or derivatives thereof, aromatic amine, tetraphenylcyclopentane or derivatives thereof, or tetraphenylbutadiene or derivatives thereof, and the like.

Specifically, there can be used known compounds such as those described in JP-A Nos. 57-51781, 59-195393 and the like, for example.

When the polymer LED of the present invention has a hole transporting layer, as the hole transporting materials used, there are exemplified polyvinylcarbazole or derivatives thereof, polysilane or derivatives thereof, polysiloxane derivatives having an aromatic amine in the side chain or the main chain, pyrazoline derivatives, arylamine derivatives, stilbene derivatives, triphenyldiamine derivatives, polyaniline or derivatives thereof, polythiophene or derivatives thereof, polypyrrole or derivatives thereof, poly(p-phenylenevinylene) or derivatives thereof, poly(2,5-thienylenevinylene) or derivatives thereof, or the like.

Specific examples of the hole transporting material include those described in JP-A Nos. 63-70257, 63-175860, 2-135359, 2-135361, 2-209988, 3-37992 and 3-152184.

Among them, as the hole transporting materials used in the hole transporting layer, preferable are polymer hole transporting materials such as polyvinylcarbazole or derivatives thereof, polysilane or derivatives thereof, polysiloxane derivatives having an aromatic amine compound group in the side chain or the main chain, polyaniline or derivatives thereof, polythiophene or derivatives thereof, poly(p-phenylenevinylene) or derivatives thereof, poly(2,5-thienylenevinylene) or derivatives thereof, or the like, and further preferable are polyvinylcarbazole or derivatives thereof, polysilane or derivatives thereof and polysiloxane derivatives having an aromatic amine compound group in the side chain or the main chain. In the case of a hole transporting material having lower molecular weight, it is preferably dispersed in a polymer binder for use.

Polyvinylcarbazole or derivatives thereof are obtained, for example, by cation polymerization or radical polymerization from a vinyl monomer.

As the polysilane or derivatives thereof, there are exemplified compounds described in Chem. Rev., 89, 1359 (1989) and GB 2300196 published specification, and the like. For synthesis, methods described in them can be used, and a Kipping method can be suitably used particularly.

As the polysiloxane or derivatives thereof, those having the structure of the above-described hole transporting material having lower molecular weight in the side chain or main chain, since the siloxane skeleton structure has poor hole transporting property. Particularly, there are exemplified those having an aromatic amine having hole transporting property in the side chain or main chain.

The method for forming a hole transporting layer is not restricted, and in the case of a hole transporting layer having lower molecular weight, a method in which the layer is formed from a mixed solution with a polymer binder is exemplified. In the case of a polymer hole transporting material, a method in which the layer is formed from a solution is exemplified.

The solvent used for the film forming from a solution is not particularly restricted providing it can dissolve a hole transporting material. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like, from a solution.

The polymer binder mixed is preferably that does not disturb charge transport extremely, and that does not have strong absorption of a visible light is suitably used. As such polymer binder, polycarbonate, polyacrylate, poly(methyl acrylate), poly(methyl methacrylate), polystyrene, poly(vinyl chloride), polysiloxane and the like are exemplified.

Regarding the thickness of the hole transporting layer, the optimum value differs depending on material used, and may properly be selected so that the driving voltage and the light emitting efficiency become optimum values, and at least a thickness at which no pin hole is produced is necessary, and too large thickness is not preferable since the driving voltage of the device increases. Therefore, the thickness of the hole transporting layer is, for example, from 1 nm to 1 μm, preferably from 2 nm to 500 nm, further preferably from 5 nm to 200 nm.

When the polymer LED of the present invention has an electron transporting layer, known compounds are used as the electron transporting materials, and there are exemplified oxadiazole derivatives, anthraquinonedimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, or metal complexes of 8-hydroxyquinoline or derivatives thereof, polyquinoline and derivatives thereof, polyquinoxaline and derivatives thereof, polyfluorene or derivatives thereof, and the like.

Specifically, there are exemplified those described in JP-A Nos. 63-70257, 63-175860, 2-135359, 2-135361, 2-209988, 3-37992 and 3-152184.

Among them, oxadiazole derivatives, benzoquinone or derivatives thereof, anthraquinone or derivatives thereof, or metal complexes of 8-hydroxyquinoline or derivatives thereof, polyquinoline and derivatives thereof, polyquinoxaline and derivatives thereof, polyfluorene or derivatives thereof are preferable, and 2-(4-biphenyl)-5-(4-t-butylphenyl)-1,3,4-oxadiazole, benzoquinone, anthraquinone, tris(8-quinolinol)aluminum and polyquinoline are further preferable.

The method for forming the electron transporting layer is not particularly restricted, and in the case of an electron transporting material having lower molecular weight, a vapor deposition method from a powder, or a method of film-forming from a solution or melted state is exemplified, and in the case of a polymer electron transporting material, a method of film-forming from a solution or melted state is exemplified, respectively.

The solvent used in the film-forming from a solution is not particularly restricted provided it can dissolve electron transporting materials and/or polymer binders. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film-forming method from a solution or melted state, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

The polymer binder to be mixed is preferably that which does not extremely disturb a charge transport property, and that does not have strong absorption of a visible light is suitably used. As such polymer binder, poly(N-vinylcarbazole), polyaniline or derivatives thereof, polythiophene or derivatives thereof, poly(p-phenylene vinylene) or derivatives thereof, poly(2,5-thienylene vinylene) or derivatives thereof, polycarbonate, polyacrylate, poly(methyl acrylate), poly(methyl methacrylate), polystyrene, poly(vinyl chloride), polysiloxane and the like are exemplified.

Regarding the thickness of the electron transporting layer, the optimum value differs depending on material used, and may properly be selected so that the driving voltage and the light emitting efficiency become optimum values, and at least a thickness at which no pin hole is produced is necessary, and too large thickness is not preferable since the driving voltage of the device increases. Therefore, the thickness of the electron transporting layer is, for example, from 1 nm to 1 μm, preferably from 2 nm to 500 nm, further preferably from 5 nm to 200 nm.

The substrate forming the polymer LED of the present invention may preferably be that does not change in forming an electrode and layers of organic materials, and there are exemplified glass, plastics, polymer film, silicon substrates and the like. In the case of a opaque substrate, it is preferable that the opposite electrode is transparent or semitransparent.

In the present invention, it is preferable that an anode is transparent or semitransparent, and as the material of this anode, electron conductive metal oxide films, semitransparent metal thin films and the like are used. Specifically, there are used indium oxide, zinc oxide, tin oxide, and films (NESA and the like) fabricated by using an electron conductive glass composed of indium.tin.oxide (ITO),indium.zinc.oxide and the like, which are metal oxide complexes, and gold, platinum, silver, copper and the like are used, and among them, ITO, indium. zinc.oxide, tin oxide are preferable. As the fabricating method, a vacuum vapor deposition method, sputtering method, ion plating method, plating method and the like are used. As the anode, there may also be used organic transparent conducting films such as polyaniline or derivatives thereof, polythiophene or derivatives thereof and the like.

The thickness of the anode can be appropriately selected while considering transmission of a light and electric conductivity, and for example, from 10 nm to 10 μm, preferably from 20 nm to 1 μm, further preferably from 50 nm to 500 nm.

Further, for easy charge injection, there may be provided on the anode a layer comprising a phthalocyanine derivative conducting polymers, carbon and the like, or a layer having an average film thickness of 2 nm or less comprising a metal oxide, metal fluoride, organic insulating material and the like.

As the material of a cathode used in the polymer LED of the present invention, that having lower work function is preferable. For example, there are used metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, or alloys comprising two of more of them, or alloys comprising one or more of them with one or more of gold, silver, platinum, copper, manganese, titanium, cobalt, nickel, tungsten and tin, graphite or graphite intercalation compounds and the like. Examples of alloys include a magnesium-silver alloy, magnesium-indium alloy, magnesium-aluminum alloy, indium-silver alloy, lithium-aluminum alloy, lithium-magnesium alloy, lithium-indium alloy, calcium-aluminum alloy and the like. The cathode may be formed into a laminated structure of two or more layers.

The thickness of the cathode can be appropriately selected while considering transmission of a light and electric conductivity, and for example, from 10 nm to 10 μm, preferably from 20 nm to 1 μm, further preferably from 50 nm to 500 nm.

As the method for fabricating a cathode, there are used a vacuum vapor deposition method, sputtering method, lamination method in which a metal thin film is adhered under heat and pressure, and the like. Further, there may also be provided, between a cathode and an organic layer, a layer comprising an conducting polymer, or a layer having an average film thickness of 2 nm or less comprising a metal oxide, metal fluoride, organic insulation material and the like, and after fabrication of the cathode, a protective layer may also be provided which protects the polymer LED. For stable use of the polymer LED for a long period of time, it is preferable to provide a protective layer and/or protective cover for protection of the device in order to prevent it from outside damage.

As the protective layer, there can be used a polymer compound, metal oxide, metal fluoride, metal borate and the like. As the protective cover, there can be used a glass plate, a plastic plate the surface of which has been subjected to lower-water-permeation treatment, and the like, and there is suitably used a method in which the cover is pasted with an device substrate by a thermosetting resin or light-curing resin for sealing. If space is maintained using a spacer, it is easy to prevent an device from being injured. If an inner gas such as nitrogen and argon is sealed in this space, it is possible to prevent oxidation of a cathode, and further, by placing a desiccant such as barium oxide and the like in the above-described space, it is easy to suppress the damage of an device by moisture adhered in the production process. Among them, any one means or more are preferably adopted.

For obtaining light emission in plane form using the polymer LED of the present invention, an anode and a cathode in the plane form may properly be placed so that they are laminated each other. Further, for obtaining light emission in pattern form, there are a method in which a mask with a window in pattern form is placed on the above-described plane light emitting device, a method in which an organic layer in non-light emission part is formed to obtain extremely large thickness providing substantial non-light emission, and a method in which any one of an anode or a cathode, or both of them are formed in the pattern. By forming a pattern by any of these methods and by placing some electrodes so that independent on/off is possible, there is obtained a display device of segment type which can display digits, letters, simple marks and the like. Further, for forming a dot matrix device, it may be advantageous that anodes and cathodes are made in the form of stripes and placed so that they cross at right angles. By a method in which a plurality of kinds of polymeric fluorescent substances emitting different colors of lights are placed separately or a method in which a color filter or luminescence converting filter is used, area color displays and multi color displays are obtained. A dot matrix display can be driven by passive driving, or by active driving combined with TFT and the like. These display devices can be used as a display of a computer, television, portable terminal, portable telephone, car navigation, view finder of a video camera, and the like.

Further, the above-described light emitting device in plane form is a thin self-light-emitting one, and can be suitably used as a flat light source for back-light of a liquid crystal display, or as a flat light source for illumination. Further, if a flexible plate is used, it can also be used as a curved light source or a display.

EXAMPLES

The following examples further illustrate the present invention in detail but do not limit the scope thereof.

Here, molecular weight was measured by gel permeation chromatography (GPC) using chloroform as a solvent, as a polystyrene reduced number-average molecular weight and a polystyrene reduced weight-average molecular weight.

Example 1

<Synthesis of Polymeric Fluorescent Substance 1>
4,4'-dibromo{4"-(4-ethylphenyl)ethenyl}triphenylamine 0.277 g, ethylene-glycol ester of 9,9-dioctyl-2,7-fluorene-diboric-acid 0.265 g, potassium carbonate 0.55 g were dissolved in toluene 8 g and ion-exchanged water 2 g, then, the atmosphere in the reaction system was purged by bubbling with nitrogen gas. To this solution, 0.08 g of palladium catalyst {Pd(PPh$_3$)$_4$} and 0.1 g of a phase transfer catalyst Aliquat 336 were added, the reaction was conducted at 80° C. for 6 hours.

After cooling the reaction solution, about 50 g of mixed solution of methanol/ion-exchanged water=10/1 were added, and resulting precipitates were collected. Next, the precipitates were washed with methanol, and dissolved in small amount of chloroform, then reprecipitation purification was conducted by adding methanol to the solution.

The precipitates were collected and dried under reduced pressure, and 0.27 g of polymer was obtained. The obtained polymer is referred to as polymeric fluorescent substance 1.

The polystyrene reduced number average molecular weight of polymeric fluorescent substance 1 was $4.4 \times 10^3$. The structure of the repeating unit contained in polymeric fluorescent substance 1, estimated from charged materials, is shown below.

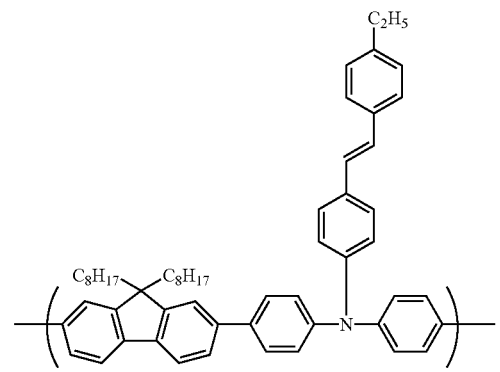

Example 2

<Synthesis of Polymeric Fluorescent Substance 2>
4,4'-dibromo{4"-(4-ethylphenyl)ethenyl}triphenylamine 0.533 g, 9,9-bis(3,7-dimethyloctyl)-2,7-fluorene diboric acid 0.534 g, and potassium carbonate 0.55 g were dissolved in 7 g of toluene and 7 g of ion-exchanged water, then, the atmosphere in the reaction system was purged by bubbling with nitrogen gas. To this solution, 0.15 g of palladium catalyst {Pd(PPh$_3$)$_4$} was added, the reaction was conducted at 80° C. for 6 hours.

After cooling this reaction solution, 7 g of toluene and 7 g of ion-exchanged water were added, and stirred and allowed to stand, then the toluene layer was collected by partitioning. After filtrating the collected solution, it was poured into methanol and resulting precipitates were collected. After being washed with ethanol, the precipitates were dried under reduced pressure, and 0.32 g of a polymer was obtained. The obtained polymer is referred to as polymeric fluorescent substance 2.

The polystyrene reduced number average molecular weight of polymeric fluorescent substance 2 was $2.5 \times 10^3$. The structure of the repeating unit contained in polymeric fluorescent substance 2, estimated from charged materials, is shown below.

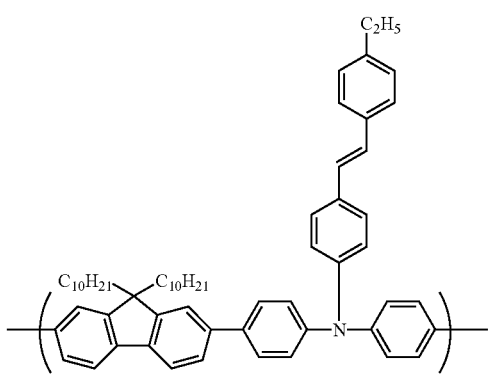

Example 3

<Synthesis of Polymeric Fluorescent Substance 3>

4,4'-dibromo-{4"-(4-t-butylphenyl)ethenyl}triphenyl amine 2.1 g and 2,2'-bipyridyl 1.38 g were dissolved in 100 g of tetrahydrofuran (dehydrated), then, the atmosphere in the reaction system was purged by bubbling with nitrogen gas. To this solution, 2.5 g of bis(1,5-cyclooctadiene)nickel (0) {Ni(COD)$_2$} was added and stirred at a room temperature for about 10 minutes, then reacted at 60° C. for 6 hours.

After cooling this reaction solution, mixed solution of 25% aqueous ammonia 25 ml/methanol 100 ml/ion-exchanged water 100 ml was added and stirred for about 1 hour. After leaving this solution at a room temperature overnight, resulting precipitates were collected by filtration. Next, after drying, the precipitates were dissolved in toluene. After removing insoluble matters by filtrating, the toluene solution was poured into methanol for the reprecipitation purification. The resulting precipitates were collected, washed with ethanol and dried under reduced pressure, and 0.4 g of a polymer was obtained. The resultant polymer is referred to as polymeric fluorescent substance 3.

The polystyrene reduced number average molecular weight of polymeric fluorescent substance 3 was $2 \times 10^4$. The structure of the repeating unit contained in polymeric fluorescent substance 3, estimated from charged materials, is shown below.

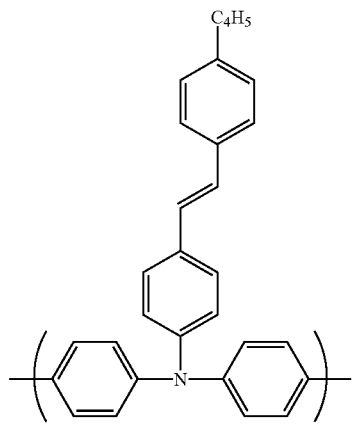

Example 4

<Synthesis of Polymeric Fluorescent Substance 4>

4,4'-dibromo-{4"-(4-t-butylphenyl)ethenyl}triphenyl amine 0.25 g 9,9'-dioctyl-2,7-dibromofluorene 0.51 g and 2,2'-bipyridyl 0.55 g were dissolved in 40 g of tetrahydrofuran (dehydrated), then, the atmosphere in the reaction system was purged by bubbling with nitrogen gas. To this solution, 1.0 g of bis(1,5-cyclooctadiene)nickel(0) {Ni (COD)$_2$} was added and stirred at a room temperature for about 10 minutes, then reacted at 60° C. for 6 hours.

After cooling this reaction solution, mixed solution of 25% aqueous ammonia 10 ml/methanol 100 ml/ion-exchanged water 100 ml was added and stirred for about 1 hour. After leaving this solution at a room temperature overnight, resulting precipitates were collected by filtration. Next, after drying, the precipitates were dissolved in toluene. After removing insoluble matters by filtrating, the toluene solution was poured into methanol for the reprecipitation purification. The resulting precipitates were collected, washed with ethanol and dried under reduced pressure, and 0.4 g of a polymer was obtained. The resultant polymer is referred to as polymeric fluorescent substance 4.

The polystyrene reduced number average molecular weight of polymeric fluorescent substance 3 was $4.1 \times 10^4$, and the weight average molecular weight is $1.2 \times 10^5$. The structure of the repeating unit contained in polymeric fluorescent substance 4, estimated from charged materials, is shown below.

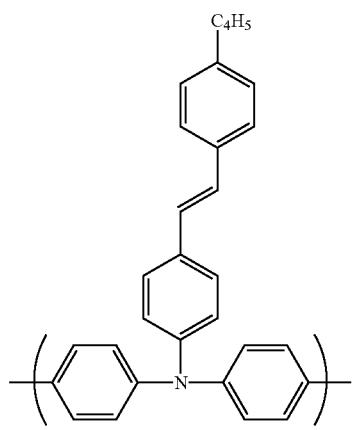

-continued

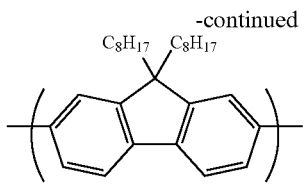

Example 5

<Measurement of Absorption Spectrum and Fluorescence Spectrum>

A 0.2% chloroform solution of a polymeric fluorescent substance was spin-coated on a quartz plate to form a thin film of the polymer. UV-visible absorption spectrum and fluorescence spectrum of the thin film were measured with a self-recording spectrophotometer UV365 (manufactured by Shimadzu Corporation) and a fluorescence spectrophotometer 850 (manufactured by Hitachi Ltd.), respectively. The fluorescence peak wavelength of polymeric fluorescent substance 1 was 448 nm, and the fluorescence peak wavelength of polymeric fluorescent substance 2 was 476 nm.

Example 6

<Production and Evaluation of Device>

On a glass substrate on which an ITO film had been disposed at a thickness of 150 nm by sputtering method, a film having a thickness of 50 nm was formed using a solution (Baytron, manufactured by Bayer) of poly(ethylenedioxythiophene)/polystyrenesulfonic acid by spin coating, and the film was dried at 120° C. for 5 minutes on a hot plate. Next, a film having a thickness of 70 nm was formed by spin coating using 1.5 wt % chloroform solution of polymeric fluorescent substance 1. Further, this film was dried at 80° C. for 1 hour under reduced pressure, then, aluminum-lithium alloy (lithium 0.5 wt %) was vapor-deposited at 50 nm as a cathode to produce a polymer LED. In vapor deposition, the degree of vacuum was always 1 to $8\times10^{-6}$ Torr. By applying voltage on the device, EL light emission from polymeric fluorescent substance 1 was obtained. The luminescence starting voltage was about 7 V, the maximum light emitting efficiency is about 0.01 cd/A, and the maximum luminance was about 20 cds/m$^2$. The EL peak wavelength was mostly in agreement with the fluorescence peak wavelength of the thin film of polymeric fluorescent substance 1, and EL luminescence from polymeric fluorescent substance 1 was confirmed.

Example 7

<Synthesis of Polymeric Fluorescent Substance 5>

4,4'-dibromo-{4"-(4-t-butylphenyl)ethenyl}triphenyl amine 0.5 g, 4,4'-dibromo-3,3'-di(3,7-dimethyloctyloxy) stilbene 1.37 g and 2,2'-bipyridyl 1.1 g were dissolved in 80 g of tetrahydrofuran (dehydrated), then, the atmosphere in the reaction system was purged by bubbling with nitrogen gas. To this solution, 2.0 g of bis(1,5-cyclooctadiene)nickel (0) {Ni(COD)$_2$} was added and stirred at a room temperature for about 10 minutes, then reacted at 60° C. for 3 hours. The reaction was carried out under nitrogen atmosphere.

After cooling this reaction solution, mixed solution of 25% aqueous ammonia 20 ml/methanol 100 ml/ion-exchanged water 150 ml was added and stirred for about 1 hour. After leaving this solution at a room temperature overnight, resulting precipitates were collected by filtration. Next, after drying, the precipitates were dissolved in toluene. After removing insoluble matters by filtrating, the toluene solution was passed through a column packed with alumina for purification. The toluene solution was poured into methanol for the reprecipitation purification. The resulting precipitates were collected, washed with ethanol and dried under reduced pressure, and 0.75 g of a polymer was obtained. The resultant polymer is referred to as polymeric fluorescent substance 5.

Example 8

<Synthesis of Polymeric Fluorescent Substance 6>

4,4'-dibromo-{4"-(4-t-butylphenyl)ethenyl}triphenyl amine 1.05 g, 1-methoxy-4-isoamyloxy-2,5-dibromobenzene 1.98 g and 2,2'-bipyridyl 2.75 g were dissolved in 200 g of tetrahydrofuran (dehydrated), then, the atmosphere in the reaction system was purged by bubbling with nitrogen gas. To this solution, 5.0 g of bis(1,5-cyclooctadiene)nickel (0) {Ni(COD)$_2$} was added and stirred at a room temperature for about 10 minutes, then reacted at 60° C. for 3.5 hours. The reaction was carried out under nitrogen atmosphere.

After cooling this reaction solution, mixed solution of 25% aqueous ammonia 50 ml/ethanol 100 ml/ion-exchanged water 150 ml was added and stirred for about 1 hour. After leaving this solution at a room temperature overnight, resulting precipitates were collected by filtration. Next, after drying, the precipitates were dissolved in toluene. After removing insoluble matters by filtrating, the toluene solution was passed through a column packed with alumina for purification. The toluene solution was poured into methanol for reprecipitation purification. The resulting precipitates were collected, washed with ethanol and dried under reduced pressure, and 0.15 g of a polymer was obtained. The resultant polymer is referred to as polymeric fluorescent substance 6.

Example 9

<Synthesis of Polymeric Fluorescent Substance 7>

4,4'-dibromo-{4"-(4-t-butylphenyl)ethenyl}triphenyl amine 0.42 g, 1-methoxy-4-isoamyloxy-2,5-dibromobenzene 2.38 g and 2,2'-bipyridyl 2.75 g were dissolved in 200 g of tetrahydrofuran (dehydrated), then, the atmosphere in the reaction system was purged by bubbling with nitrogen gas. To this solution, 5.0 g of bis(1,5-cyclooctadiene)nickel (0) {Ni(COD)$_2$} was added and stirred at a room temperature for about 10 minutes, then reacted at 60° C. for 3.5 hours. The reaction was carried out under nitrogen atmosphere.

After cooling this reaction solution, mixed solution of 25% aqueous ammonia 50 ml/ethanol 100 ml/ion-exchanged water 150 ml was added and stirred for about 1 hour. After leaving this solution at a room temperature overnight, resulting precipitates were collected by filtration. Next, after drying, the precipitates were dissolved in toluene. After removing insoluble matters by filtrating, the toluene solution was passed through a column packed with alumina for purification. The toluene solution was washed with 1N-HCl aqueous solution, and further with ion-exchanged water. By evaporating toluene, precipitates were obtained. The resulting precipitates were washed with ethanol and dried under reduced pressure, and 0.37 g of a polymer was obtained. The resultant polymer is referred to as polymeric fluorescent substance 7.

Example 10

<Synthesis of Polymeric Fluorescent Substance 8>
4,4'-dibromo-{4"-(4-t-butylphenyl)ethenyl}triphenyl amine 0.21 g, 9,9-dioxtyl-2,7-dibromofluorene 3.9 g and 2,2'-bipyridyl 2.75 g were dissolved in 200 g of tetrahydrofuran (dehydrated), then, the atmosphere in the reaction system was purged by bubbling with nitrogen gas. To this solution, 5.0 g of bis(1,5-cyclooctadiene)nickel(0) {Ni(COD)$_2$} was added and stirred at a room temperature for about 10 minutes, then reacted at 60° C. for 3.5 hours. The reaction was carried out under nitrogen atmosphere.

After cooling this reaction solution, mixed solution of 25% aqueous ammonia 50 ml/methanol 100 ml/ion-exchanged water 150 ml was added and stirred for about 1 hour. After leaving this solution at a room temperature overnight, resulting precipitates were collected by filtration. Next, after drying, the precipitates were dissolved in toluene. After removing insoluble matters by filtrating, the toluene solution was passed through a column packed with silica gel for purification. The toluene solution was poured into methanol for reprecipitation purification. The resulting precipitates were collected, washed with ethanol and dried under reduced pressure, and 1.0 g of a polymer was obtained. The resultant polymer is referred to as polymeric fluorescent substance 8.

Example 11

<Synthesis of Polymeric Fluorescent Substance 9>
4,4'-dibromo-{4"-(β,β-diphenyl)ethenyl}triphenylamine 1.09 g, 1,4-di(3,7-dimethyloctyloxy)-2,5-dibromobenzene 3.1 g and 2,2'-bipyridyl 2.75 g were dissolved in 200 g of tetrahydrofuran (dehydrated), then, the atmosphere in the reaction system was purged by bubbling with nitrogen gas. To this solution, 5.0 g of bis(1,5-cyclooctadiene)nickel(0) {Ni(COD)$_2$} was added and stirred at a room temperature for about 10 minutes, then reacted at 60° C. for 3.5 hours. The reaction was carried out under nitrogen atmosphere.

After cooling this reaction solution, mixed solution of 25% aqueous ammonia 50 ml/methanol 100 ml/ion-exchanged water 150 ml was added and stirred for about 1 hour. After leaving this solution at a room temperature overnight, resulting precipitates were collected by filtration. Next, after drying, the precipitates were dissolved in toluene. After removing insoluble matters by filtrating, the toluene solution was passed through a column packed with alumina for purification. The toluene solution was poured into methanol for reprecipitation purification. The resulting precipitates were collected, washed with ethanol and dried under reduced pressure, and 0.3 g of a polymer was obtained. The resultant polymer is referred to as polymeric fluorescent substance 9.

Example 12

<Synthesis of Polymeric Fluorescent Substance 10>
4,4'-dibromo-{4"-(β,β-diphenyl)ethenyl}triphenyl amine 0.5 g, 9,9-dioxtyl-2,7-dibromofluorene 1.55 g and 2,2'-bipyridyl 1.37 g were dissolved in 100 g of tetrahydrofuran (dehydrated), then, the atmosphere in the reaction system was purged by bubbling with nitrogen gas. To this solution, 2.5 g of bis(1,5-cyclooctadiene)nickel(0) {Ni(COD)$_2$} was added and stirred at a room temperature for about 10 minutes, then reacted at 60° C. for 3 hours. The reaction was carried out under nitrogen atmosphere.

After cooling this reaction solution, mixed solution of 25% aqueous ammonia 25 ml/methanol 100 ml/ion-exchanged water 150 ml was added and stirred for about 1 hour. After leaving this solution at a room temperature overnight, resulting precipitates were collected by filtration. Next, after drying, the precipitates were dissolved in toluene. After removing insoluble matters by filtrating, the toluene solution was passed through a column packed with silica gel for purification. The toluene solution was poured into methanol for reprecipitation purification. The resulting precipitates were collected, washed with ethanol and dried under reduced pressure, and 0.4 g of a polymer was obtained. The resultant polymer is referred to as polymeric fluorescent substance 10.

Example 13

<Synthesis of Polymeric Fluorescent Substance 8>
4,4'-dibromo-{4"-(4-t-butylphenyl)ethenyl}triphenyl amine 0.21 g, 4,4'-dibromo-3,3'-di(3,7-dimethyloctyloxy)stilbene 1.22 g and 2,2'-bipyridyl 1.37 g were dissolved in 100 g of tetrahydrofuran (dehydrated), then, the atmosphere in the reaction system was purged by bubbling with nitrogen gas. To this solution, 2.5 g of bis(1,5-cyclooctadiene)nickel(0) {Ni(COD)$_2$} was added and stirred at a room temperature for about 10 minutes, then reacted at 60° C. for 3 hours. The reaction was carried out under nitrogen atmosphere.

After cooling this reaction solution, mixed solution of 25% aqueous ammonia 25 ml/methanol 100 ml/ion-exchanged water 150 ml was added and stirred for about 1 hour. After leaving this solution at a room temperature overnight, resulting precipitates were collected by filtration. Next, after drying, the precipitates were dissolved in toluene. After removing insoluble matters by filtrating, the toluene solution was passed through a column packed with silica gel for purification. The toluene solution was poured into methanol for reprecipitation purification. The resulting precipitates were collected, washed with ethanol and dried under reduced pressure, and 1.0 g of a polymer was obtained. The resultant polymer is referred to as polymeric fluorescent substance 11.

Example 14

<Synthesis of Polymeric Fluorescent Substance 12>
4,4'-dibromo-{4"-(4-t-butylphenyl)ethenyl}triphenyl amine 0.17 g, 4,4'-dibromo-3,3'-di(3,7-dimethyloctyloxy)stilbene 1.75 g and 2,2'-bipyridyl 1.1 g were dissolved in 80 g of tetrahydrofuran (dehydrated), then, the atmosphere in the reaction system was purged by bubbling with nitrogen gas. To this solution, 2.0 g of bis(1,5-cyclooctadiene)nickel(0) {Ni(COD)$_2$} was added and stirred at a room temperature for about 10 minutes, then reacted at 60° C. for 3 hours. The reaction was carried out under nitrogen atmosphere.

After cooling this reaction solution, mixed solution of 25% aqueous ammonia 20 ml/methanol 100 ml/ion-exchanged water 150 ml was added and stirred for about 1 hour. After leaving this solution at a room temperature overnight, resulting precipitates were collected by filtration. Next, after drying, the precipitates were dissolved in toluene. After removing insoluble matters by filtrating, the toluene solution was passed through a column packed with alumina for purification. The toluene solution was poured into methanol for reprecipitation purification. The resulting precipitates were collected, washed with ethanol and dried under reduced pressure, and 0.14 g of a polymer was obtained. The resultant polymer is referred to as polymeric fluorescent substance 12.

Example 15

<Synthesis of Polymeric Fluorescent Substance 13>

4,4'-dibromo-{4"-(4-t-butylphenyl)ethenyl}triphenyl amine 0.5 g, 4,4'-dibromo-3,3'-di(3,7-dimethyloctyloxy) stilbene 0.68 g, 1-methoxy-4-isoamyloxy-2,5-dibromobenzene 0.37 g and 2,2'-bipyridyl 1.1 g were dissolved in 80 g of tetrahydrofuran (dehydrated), then, the atmosphere in the reaction system was purged by bubbling with nitrogen gas. To this solution, 2.0 g of bis(1,5-cyclooctadiene)nickel(0) {Ni(COD)$_2$} was added and stirred at a room temperature for about 10 minutes, then reacted at 60° C. for 3 hours. The reaction was carried out under nitrogen atmosphere.

After cooling this reaction solution, mixed solution of 25% aqueous ammonia 20 ml/methanol 100 ml/ion-exchanged water 150 ml was added and stirred for about 1 hour. After leaving this solution at a room temperature overnight, resulting precipitates were collected by filtration. Next, after drying, the precipitates were dissolved in toluene. After removing insoluble matters by filtrating, the toluene solution was passed through a column packed with alumina for purification. The toluene solution was poured into methanol for reprecipitation purification. The resulting precipitates were collected, washed with ethanol and dried under reduced pressure, and 0.55 g of a polymer was obtained. The resultant polymer is referred to as polymeric fluorescent substance 13.

Example 16

<Synthesis of Polymeric Fluorescent Substance 14>

4,4'-dibromo-{4"-(4-t-butylphenyl)ethenyl}triphenyl amine 0.17 g, 4,4'-dibromo-3,3'-di(3,7-dimethyloctyloxy) stilbene 0.88 g, 1-methoxy-4-isoamyloxy-2,5-dibromobenzene 0.48 g and 2,2'-bipyridyl 1.1 g were dissolved in 80 g of tetrahydrofuran (dehydrated), then, the atmosphere in the reaction system was purged by bubbling with nitrogen gas. To this solution, 2.0 g of bis(1,5-cyclooctadiene)nickel(0) {Ni(COD)$_2$} was added and stirred at a room temperature for about 10 minutes, then reacted at 60° C. for 3 hours. The reaction was carried out under nitrogen atmosphere.

After cooling this reaction solution, mixed solution of 25% aqueous ammonia 20 ml/methanol 100 ml/ion-exchanged water 150 ml was added and stirred for about 1 hour. After leaving this solution at a room temperature overnight, resulting precipitates were collected by filtration. Next, after drying, the precipitates were dissolved in toluene. After removing insoluble matters by filtrating, the toluene solution was passed through a column packed with alumina for purification. The toluene solution was poured into methanol for reprecipitation purification. The resulting precipitates were collected, washed with ethanol and dried under reduced pressure, and 0.48 g of a polymer was obtained. The resultant polymer is referred to as polymeric fluorescent substance 14.

Example 17

<Synthesis of Polymeric Fluorescent Substance 15>

4,4'-dibromo-{4"-(4-t-butylphenyl)ethenyl}triphenyl amine 0.5 g, 4,4'-dibromo-3,3'-di(3,7-dimethyloctyloxy) stilbene 0.68 g, 9,9-dioctyl-2,7-dibromofluorene 0.58 g and 2,2'-bipyridyl 1.1 g were dissolved in 80 g of tetrahydrofuran (dehydrated), then, the atmosphere in the reaction system was purged by bubbling with nitrogen gas. To this solution, 2.0 g of bis(1,5-cyclooctadiene)nickel(0) {Ni(COD)$_2$} was added and stirred at a room temperature for about 10 minutes, then reacted at 60° C. for 3 hours. The reaction was carried out under nitrogen atmosphere.

After cooling this reaction solution, mixed solution of 25% aqueous ammonia 20 ml/methanol 100 ml/ion-exchanged water 150 ml was added and stirred for about 1 hour. After leaving this solution at a room temperature overnight, resulting precipitates were collected by filtration. Next, after drying, the precipitates were dissolved in toluene. After removing insoluble matters by filtrating, the toluene solution was passed through a column packed with alumina for purification. The toluene solution was poured into methanol for reprecipitation purification. The resulting precipitates were collected, washed with ethanol and dried under reduced pressure, and 0.65 g of a polymer was obtained. The resultant polymer is referred to as polymeric fluorescent substance 15.

Example 18

<Synthesis of Polymeric Fluorescent Substance 16>

4,4'-dibromo-{4"-(4-t-butylphenyl)ethenyl}triphenyl amine 0.34 g, 4,4'-dibromo-3,3'-di(3,7-dimethyloctyloxy) stilbene 0.2 g, 1-methoxy-4-isoamyloxy-2,5-dibromobenzene 0.74 g and 2,2'-bipyridyl 1.1 g were dissolved in 80 g of tetrahydrofuran (dehydrated), then, the atmosphere in the reaction system was purged by bubbling with nitrogen gas. To this solution, 2.0 g of bis(1,5-cyclooctadiene)nickel(0) {Ni(COD)$_2$} was added and stirred at a room temperature for about 10 minutes, then reacted at 60° C. for 3 hours. The reaction was carried out under nitrogen atmosphere.

After cooling this reaction solution, mixed solution of 25% aqueous ammonia 20 ml/methanol 100 ml/ion-exchanged water 150 ml was added and stirred for about 1 hour. After leaving this solution at a room temperature overnight, resulting precipitates were collected by filtration. Next, after drying, the precipitates were dissolved in toluene. After removing insoluble matters by filtrating, the toluene solution was passed through a column packed with alumina for purification. The toluene solution was poured into methanol for reprecipitation purification. The resulting precipitates were collected, washed with ethanol and dried under reduced pressure, and 0.18 g of a polymer was obtained. The resultant polymer is referred to as polymeric fluorescent substance 16.

Example 19

<Synthesis of Polymeric Fluorescent Substance 17>

As the same manner with Example 18 except that 9,9-diocyl-2,7-dibromofluorene 1.15 g was used instead of 1-methoxy-4-isoamyloxy-2,5-dibromobenzene 0.74 g, 0.36 g of a polymer was obtained. The resultant polymer is referred to as polymeric fluorescent substance 17.

Example 20

<Synthesis of Polymeric Fluorescent Substance 18>

4,4'-dibromo-{4"-(4-t-butylphenyl)ethenyl}triphenyl amine 0.65 g, 1-methoxy-4-isoamyloxy-2,5-dibromobenzene 0.93 g and 2,2'-bipyridyl 1.38 g were dissolved in 100 g of tetrahydrofuran (dehydrated), then, the atmosphere in the reaction system was purged by bubbling with nitrogen gas. To this solution, 2.5 g of bis(1,5-cyclooctadiene)nickel (0) {Ni(COD)$_2$} was added and stirred at a room temperature for about 10 minutes, then reacted at 60° C. for 3 hours. The reaction was carried out under nitrogen atmosphere.

After cooling this reaction solution, mixed solution of 25% aqueous ammonia 20 ml/methanol 100 ml/ion-exchanged water 150 ml was added and stirred for about 1 hour. After leaving this solution at a room temperature overnight, resulting precipitates were collected by filtration. Next, after drying, the precipitates were dissolved in toluene. After removing insoluble matters by filtrating, the toluene solution was passed through a column packed with alumina for purification. The toluene solution was poured into methanol for reprecipitation purification. The resulting precipitates were collected, washed with ethanol and dried under reduced pressure, and 0.1 g of a polymer was obtained. The resultant polymer is referred to as polymeric fluorescent substance 18.

Example 21

<Synthesis of Polymeric Fluorescent Substance 19>

4,4'-dibromo-{4"-(4-t-butylphenyl)ethenyl}triphenyl amine 1.18 g, 9,9-dioctyl-2,7-dibromofluorene 0.49 g and 2,2'-bipyridyl 1.1 g were dissolved in 80 g of tetrahydrofuran (dehydrated), then, the atmosphere in the reaction system was purged by bubbling with nitrogen gas. To this solution, 2.0 g of bis(1,5-cyclooctadiene)nickel(0) {Ni(COD)$_2$} was added and stirred at a room temperature for about 10 minutes, then reacted at 60° C. for 3.5 hours. The reaction was carried out under nitrogen atmosphere.

After cooling this reaction solution, mixed solution of 25% aqueous ammonia 20 ml/methanol 100ml/ion-exchanged water 150 ml was added and stirred for about 1 hour. After leaving this solution at a room temperature overnight, resulting precipitates were collected by filtration. Next, after drying, the precipitates were dissolved in toluene. After removing insoluble matters by filtrating, the toluene solution was passed through a column packed with alumina for purification. The toluene solution was poured into methanol for reprecipitation purification. The resulting precipitates were collected, washed with ethanol and dried under reduced pressure, and 0.4 g of a polymer was obtained. The resultant polymer is referred to as polymeric fluorescent substance 19.

Example 22

<Synthesis of Polymeric Fluorescent Substance 20>

As the same manner with Example 21 except that 4,4'-dibromo-{4"-(4-t-butylphenyl)ethenyl}triphenylamine 0.84 g, 4,4'-dibromo-3,3'-di(3,7-dimethyloctyloxy)stilbene 0.49 g and 9,9-dioctyl-2,7-dibromofluorene 0.41 g were used instead of 4,4'-dibromo-(4"-{4-t-butylphenyl}ethenyl) triphenyl amine 1.18 g and 9,9-dioctyl-2,7-dibromofluorene 0.49 g, 0.45 g of a polymer was obtained. The resultant polymer is referred to as polymeric fluorescent substance 20.

Example 23

<Synthesis of Polymeric Fluorescent Substance 21>

As the same manner with Example 22 except that 4,4'-dibromo-{4"-(4-t-butylphenyl)ethenyl}triphenyl amine 1.18 g, 4,4'-dibromo-3,3'-di(3,7-dimethyloctyloxy)stilbene 0.29 g and 9,9-dioctyl-2,7-dibromofluorene 0.25 g were used, 0.25 g of a polymer was obtained. The resultant polymer is referred to as polymeric fluorescent substance 21.

Example 24

<Synthesis of Polymeric Fluorescent Substance 22>

4,4'-dibromo-{4"-(β-naphtyl)ethenyl}triphenyl amine 0.5 g, 9,9-dioctyl-2,7-dibromofluorene 1.15 g and 2,2'-bipyridyl 1.1 g were dissolved in 80 g of tetrahydrofuran (dehydrated), then, the atmosphere in the reaction system was purged by bubbling with nitrogen gas. To this solution, 2.0 g of bis(1,5-cyclooctadiene)nickel(0) {Ni(COD)$_2$} was added and stirred at a room temperature for about 10 minutes, then reacted at 60° C. for 3 hours. The reaction was carried out under nitrogen atmosphere.

After cooling this reaction solution, mixed solution of 25% aqueous ammonia 20ml/methanol 100 ml/ion-exchanged water 150 ml was added and stirred for about 1 hour. After leaving this solution at a room temperature overnight, resulting precipitates were collected by filtration. Next, after drying, the precipitates were dissolved in toluene. After removing insoluble matters by filtrating, the toluene solution was passed through a column packed with alumina for purification. The toluene solution was poured into methanol for reprecipitation purification. The resulting precipitates were collected, washed with ethanol and dried under reduced pressure, and 0.8 g of a polymer was obtained. The resultant polymer is referred to as polymeric fluorescent substance 22.

Example 25

<Synthesis of Polymeric Fluorescent Substance 23>

As the same manner with Example 24 except that 4,4'-dibromo-{4"-(β-biphenyl)ethenyl}triphenylamine 0.52 g was used instead of 4,4'-dibromo-{4"-(β-naphthyl)ethenyl} triphenylamine 0.5 g, 0.39 g of a polymer was obtained. The resultant polymer is referred to as polymeric fluorescent substance 23.

Example 26

<Synthesis of Polymeric Fluorescent Substance 24>

As the same manner with Example 24 except that 4,4'-dibromo-{4"-(4-methoxyphenyl)ethenyl}triphenylamine 0.48 g was used instead of 4,4'-dibromo-{4"-(β-naphthyl) ethenyl}triphenylamine 0.5 g, 0.66 g of a polymer was obtained. The resultant polymer is referred to as polymeric fluorescent substance 24.

Example 27

<Synthesis of Polymeric Fluorescent Substance 25>

4,4'-dibromo-{4"-(4-methoxyphenyl)ethenyl}triphenyl amine 0.6 g, 1-methoxy-4-isoamuloxy-2,5-dibromobenzene 0.92 g and 2,2'-bipyridyl 1.38 g were dissolved in 100 g of tetrahydrofuran (dehydrated), then, the atmosphere in the reaction system was purged by bubbling with nitrogen gas. To this solution, 2.5 g of bis(1,5-cyclooctadiene)nickel(0) {Ni(COD)₂} was added and stirred at a room temperature for about 10 minutes, then reacted at 60° C. for 3 hours. The reaction was carried out under nitrogen atmosphere.

After cooling this reaction solution, mixed solution of 25% aqueous ammonia 20 ml/methanol 100 ml/ion-exchanged water 150 ml was added and stirred for about 1 hour. After leaving this solution at a room temperature overnight, resulting precipitates were collected by filtration. Next, after drying, the precipitates were dissolved in toluene. After removing insoluble matters by filtrating, the toluene solution was passed through a column packed with alumina for purification. The toluene solution was poured into methanol for reprecipitation purification. The resulting precipitates were collected, washed with ethanol and dried under reduced pressure, and 0.4 g of a polymer was obtained. The resultant polymer is referred to as polymeric fluorescent substance 25.

Example 28

<Synthesis of Polymeric Fluorescent Substance 26>

4,4'-dibromo-{4"-(β-cyano-β-(4-methoxyphenyl))ethenyl}triphenyl amine 1.26 g, 9,9-dioctyl-2,7-dibromofluorene 2.28 g and 2,2'-bipyridyl 2.75 g were dissolved in 200 g of tetrahydrofuran (dehydrated), then, the atmosphere in the reaction system was purged by bubbling with nitrogen gas. To this solution, 5.0 g of bis(1,5-cyclooctadiene)nickel (0) {Ni(COD)₂} was added and stirred at a room temperature for about 10 minutes, then reacted at 60° C. for 3 hours. The reaction was carried out under nitrogen atmosphere.

After cooling this reaction solution, mixed solution of methanol 100 ml/ion-exchanged water 200 ml was added and stirred for about 1 hour. After leaving this solution at a room temperature overnight, resulting precipitates were collected by filtration. Next, after drying, the precipitates were dissolved in toluene. After removing insoluble matters by filtrating, the toluene solution was passed through a column packed with silica gel for purification. The toluene solution was poured into methanol for reprecipitation purification. The resulting precipitates were collected, washed with ethanol and dried under reduced pressure, and 1.0 g of a polymer was obtained. The resultant polymer is referred to as polymeric fluorescent substance 26.

Example 29

<Synthesis of Polymeric Fluorescent Substance 27>

As the same manner with Example 24 except that 4,4'-dibromo-{4"-(2,4-dimethoxyphenyl)ethenyl}triphenyl amine 0.45 g was used instead of 4,4'-dibromo-{4"-(β-naphtyl)ethenyl}triphenyl amine 0.5 g, 0.37 g of a polymer was obtained. The resultant polymer is referred to as polymeric fluorescent substance 27.

Example 30

<Fluorescence Characteristics of Polymeric Fluorescent Substances 5-27>

Polymeric fluorescent substances 5-27 were synthesized as above. The monomer charging ratio used for synthesis and the structures of the repeating units of polymeric fluorescent substances 5-27, together with polymeric fluorescent substance 4, are respectively shown in Table 1. The fluorescence spectra of polymeric fluorescent substances 4-27 were measured as the same manner with that of Example 5. The average molecular weight and the fluorescence peak wavelength of polymeric fluorescent substances 5-27 are shown in Table 2. All polymeric fluorescent substances had strong visible fluorescence.

TABLE 1

Repeating units of polymeric fluorescent substances 4–27 and monomer charging ratio.

| Polymeric fluorescent substance No. | Structure of repeating unit 1 | Structure of repeating unit 3-A | Structure of repeating unit 3-B | Monomer (dibromocompound) charging amount (mmole). |
|---|---|---|---|---|
| 4 | TPAST-tBu | F8 | — | 0.45:0.9 |
| 5 | TPAST-tBu | ST10 | — | 0.9:2.1 |
| 6 | TPAST-tBu | PP5 | — | 1.9:5.6 |
| 7 | TPAST-tBu | PP5 | — | 0.75:6.8 |
| 8 | TPAST-tBu | F8 | — | 0.37:7.1 |
| 9 | TPAST-Ph2 | PP10 | — | 1.9:5.6 |
| 10 | TPAST-Ph2 | F8 | — | 0.86:2.8 |
| 11 | TPAST-tBu | ST10 | — | 1.9:1.8 |
| 12 | TPAST-tBu | ST10 | — | 0.3:2.7 |
| 13 | TPAST-tBu | ST10 | PP5 | 0.9:1.0:1.0 |
| 14 | TPAST-tBu | ST10 | PP5 | 0.3:1.4:1.4 |
| 15 | TPAST-tBu | ST10 | F8 | 0.9:1.1:1.1 |
| 16 | TPAST-tBu | PP5 | ST10 | 0.6:2.1:0.3 |
| 17 | TPAST-tBu | F8 | ST10 | 0.6:2.1:0.3 |
| 18 | TPAST-Ph2 | PP5 | — | 1.1:2.6 |
| 19 | TPAST-tBu | F8 | — | 2.1:0.9 |
| 20 | TPAST-tBu | F8 | ST10 | 1.5:0.75:0.75 |
| 21 | TPAST-tBu | F8 | ST10 | 2.1:0.45:0.45 |
| 22 | TPAST-N | F8 | — | 0.9:2.1 |
| 23 | TPAST-BPh | F8 | — | 0.9:2.1 |
| 24 | TPAST-OMe | F8 | — | 0.9:2.1 |
| 25 | TPAST-OMe | PP5 | — | 1.1:2.6 |
| 26 | TPAST(CN)Ph | F8 | — | 2.3:5.3 |
| 27 | TPAST-(OMe)2 | F8 | — | 0.8:2.1 |

Structures of the repeating units

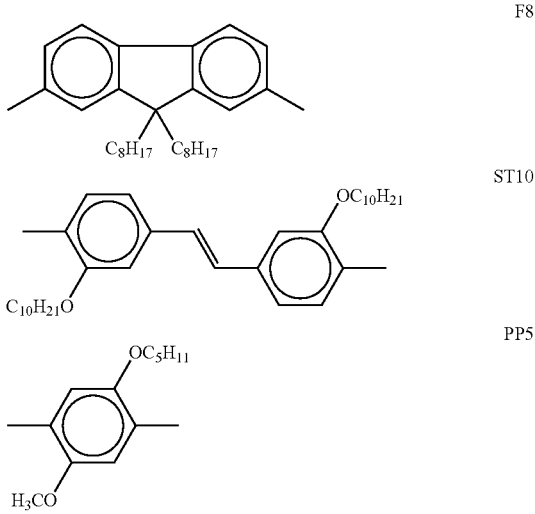

PP10
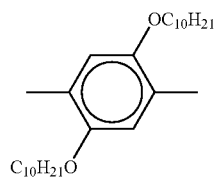
In the above formulae, $C_{10}H_{21}$ means 3,7-dimethyloctyl group, and $C_5H_{11}$ means iso-amyl group.
TPAST-tBu:
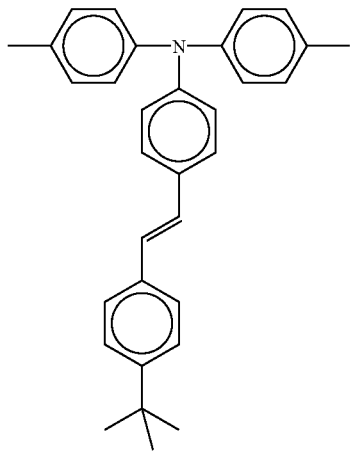
TPAST-Ph2:
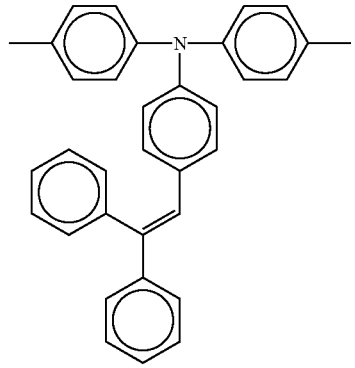
TPAST-N:
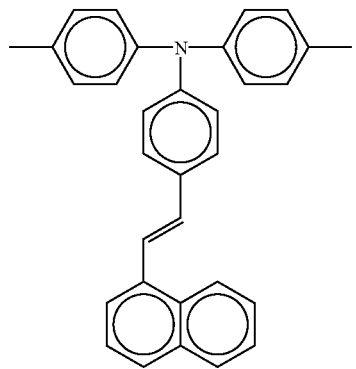
TPAST-BPh:
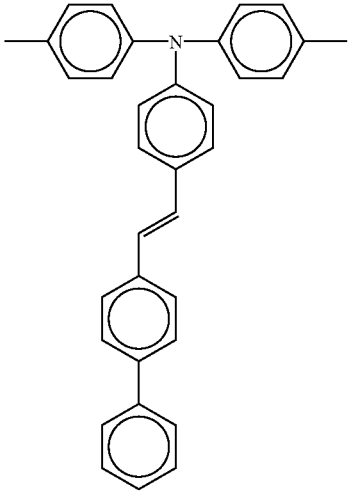
TPAST-OMe:
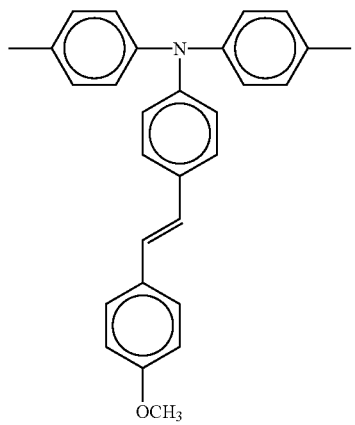
TPAST(CN)Ph:
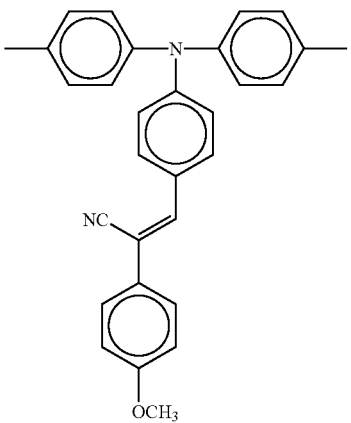

-continued

TPAST(OMe)2:
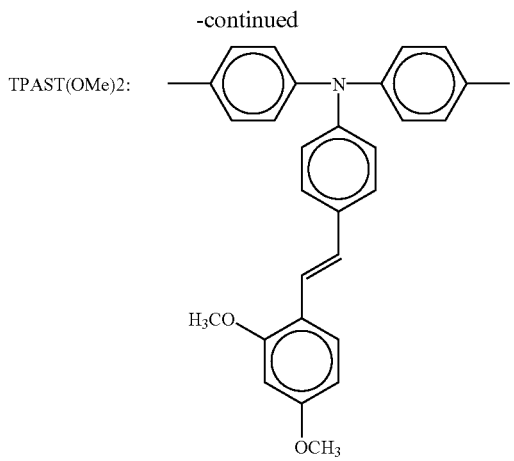

TABLE 2

Molecular weight and fluorescence peak wavelength of polymeric fluorescent substances 4–27

| Polymeric fluorescent substance No. | Number average molecular weight | Weight average molecular weight | Fluorescence peak wavelength (nm) |
|---|---|---|---|
| 4 | $4.1 \times 10^4$ | $1.2 \times 10^5$ | 444 |
| 5 | $7.9 \times 10^4$ | $1.5 \times 10^5$ | 472 |
| 6 | $1.8 \times 10^4$ | $3.6 \times 10^4$ | 446 |
| 7 | $4.1 \times 10^4$ | $6.4 \times 10^4$ | 444 |
| 8 | $6.9 \times 10^4$ | $1.6 \times 10^5$ | 440 |
| 9 | $6.6 \times 10^3$ | $9.8 \times 10^3$ | 472 |
| 10 | $4.5 \times 10^4$ | $1.2 \times 10^5$ | 470 |
| 11 | $2.8 \times 10^4$ | $6.1 \times 10^4$ | 474 |
| 12 | $2.0 \times 10^5$ | $5.4 \times 10^5$ | 468 |
| 13 | $5.0 \times 10^4$ | $9.6 \times 10^4$ | 470 |
| 14 | $6.7 \times 10^4$ | $1.2 \times 10^5$ | 464 |
| 15 | $6.2 \times 10^4$ | $1.6 \times 10^5$ | 470 |
| 16 | $3.4 \times 10^4$ | $5.9 \times 10^4$ | 466 |
| 17 | $3.5 \times 10^4$ | $7.4 \times 10^4$ | 464 |
| 18 | $3.4 \times 10^4$ | $6.4 \times 10^4$ | 480 |
| 19 | $1.4 \times 10^4$ | $4.0 \times 10^4$ | 448 |
| 20 | $3.4 \times 10^4$ | $1.1 \times 10^5$ | 472 |
| 21 | $2.1 \times 10^4$ | $5.5 \times 10^4$ | 470 |
| 22 | $5.6 \times 10^4$ | $1.7 \times 10^5$ | 466 |
| 23 | $7.4 \times 10^3$ | $1.4 \times 10^4$ | 472 |
| 24 | $1.0 \times 10^5$ | $3.7 \times 10^5$ | 448 |
| 25 | $2.1 \times 10^4$ | $4.8 \times 10^4$ | 450 |
| 26 | $5.4 \times 10^4$ | $3.7 \times 10^5$ | 522 |
| 27 | $1.5 \times 10^4$ | $2.7 \times 10^4$ | 454 |

Examples 31-40

<Evaluation of Device>

Films of the light emitting layer were formed by spin coating using 1.5 wt % toluene solution of each polymeric fluorescent substances, and polymer LEDs were produced as the same manner with Example 6 except that lithium fluoride 4 nm, calcium 5 nm, and aluminium 50 nm were deposited in this order to form a cathode. By applying voltage to the resultant device, EL luminescence was obtained, respectively from the polymeric fluorescent substances used. Characteristics are shown in Table 3.

TABLE 3

Characteristics of polymer LED

| | Light-emitting material | Stating voltage of light emission (V) | Maximum light emitting efficiency (cd/A) | Luminescence peak wavelength (nm) |
|---|---|---|---|---|
| Example 31 | Polymeric fluorescent substance 4 | 3.7 | 0.69 | 440 |
| Example 32 | Polymeric fluorescent substance 5 + Polyfluorene (30:70) | 3.2 | 3.24 | 472 |
| Example 33 | Polymeric fluorescent substance 6 | 3.7 | 0.95 | 436 |
| Example 34 | Polymeric fluorescent substance 10 | 3.3 | 1.16 | 464 |
| Example 35 | Polymeric fluorescent substance 22 | 3.9 | 0.73 | 468 |
| Example 36 | Polymeric fluorescent substance 23 + Polyfluorene (30:70) | 3.6 | 0.48 | 468 |
| Example 37 | Polymeric fluorescent substance 24 | 3.7 | 0.60 | 464 |
| Example 38 | Polymeric fluorescent substance 25 | 3.8 | 1.10 | 436 |
| Example 39 | Polymeric fluorescent substance 26 + Polyfluorene (30:70) | 5.6 | 0.76 | 512 |
| Example 40 | Polymeric fluorescent substance 27 + Polyfluorene (30:70) | 3.5 | 0.68 | 460 |

The starting voltage of light emission is an applied voltage showing 1 cd of light emission.

The polymeric fluorescent substance of the present invention is a triarylamine type polymeric fluorescent substance, and excellent in quantum yield of fluorescence and in light emitting efficiency of the device using thereof. Accordingly, a polymer LED using the polymeric fluorescent substance exhibits excellent luminescence characteristics, and can be preferably used for a flat light source as back light, and for apparatus such as a flat-panel display.

What is claimed is:

1. A polymeric fluorescent substance exhibiting visible fluorescence in the solid state, having polystyrene reduced number average molecular weight of $1 \times 10^3$ to $1 \times 10^8$, and comprising repeating units of following formula (1) in the main chain,

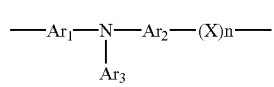

wherein $Ar_1$ and $Ar_2$ each independently represent an arylene group or a divalent heterocyclic compound group; side chain $Ar_3$ represents an aryl group having one or more substituents of formula (2) or represents a heterocyclic group having one or more substituents of formula (2) as nuclear substitution; X represents $-CR_1=CR_2-$ or $-C\equiv C-$; $R_1$ and $R_2$ each independently represent a group selected from a hydrogen atom, an alkyl group, an aryl group, a monovalent heterocyclic compound group, and cyano group; n is 0, $$-Y-Ar_4 \qquad (2)$$

wherein $Ar_4$ represents an aryl group, a monovalent heterocyclic compound group or a monovalent aromatic amine group; Y represents $-CR_3=CR_4-$ or $-C\equiv C-$; $R_3$ and $R_4$ each independently represent a group selected from a hydrogen atom, an alkyl group, an aryl group, a monovalent heterocyclic compound group and cyano group.

2. A polymeric fluorescent substance according to claim 1 wherein the total amount of repeating unit represented by formula (1) is 1% by mole or more and 100% by mole or less based on all repeating units.

3. A polymeric fluorescent substance according to claim 1 or 2 comprising one or more repeating units of formula (1) and one or more repeating units of the following formula (3), $$-Ar_5-(Z)p- \qquad (3)$$

wherein $Ar_5$ represents an arylene group or a divalent heterocyclic compound group; Z represents $-CR_5=CR_6-$ or $-C\equiv C-$; $R_5$ and $R_6$ each independently represent a group selected from a hydrogen atom, an alkyl group, an aryl group, a monovalent heterocyclic compound group, and cyano group; and p is 0 or 1.

4. A polymeric fluorescent substance according to claim 3 wherein the total amount of repeating units represented by formula (1) and formula (3) is 50% by mole or more based on all repeating units; the repeating unit represented by formula (1) is 2% by mole or more and 90% by mole or less, and the repeating unit represented by formula (3) is 10% by mole or more and 98% by mole or less, based on the total amount of repeating units represented by formula (1) and formula (3).

5. A polymer light-emitting device comprising at least a light emitting layer between a pair of electrodes composed of anode and a cathode at least one of which is transparent or semi-transparent wherein the light emitting layer comprises a polymeric fluorescent substance according to any one of claims 1 to 4.

6. A polymer light-emitting device according to claim 5 wherein a layer containing a conductive polymer is disposed between at least one of the electrode and a light emitting layer such that the layer containing a conductive polymer is adjacent to said electrode.

7. A polymer light-emitting device according to claim 5 wherein an insulating layer having a film thickness of 2 nm or less is disposed between at least one of the electrode and a light emitting layer such that the insulating layer is adjacent to said electrode.

8. A flat light source comprising a polymer light-emitting device according to claim 5.

9. A segment display apparatus comprising a polymer light-emitting device according to claim 5.

10. A dot-matrix display apparatus comprising a polymer light-emitting device according to claim 5.

11. A liquid crystal display comprising a polymer light-emitting device according to claim 5 as a back light.

12. A flat light source comprising a polymer light-emitting device according to claim 6.

13. A segment display apparatus comprising a polymer light-emitting device according to claim 6.

14. A dot-matrix display apparatus comprising a polymer light-emitting device according to claim 6.

15. A liquid crystal display comprising a polymer light-emitting device according to claim 6 as a back light.

16. A flat light source comprising a polymer light-emitting device according to claim 7.

17. A segment display apparatus comprising a polymer light-emitting device according to claim 7.

18. A dot-matrix display apparatus comprising a polymer light-emitting device according to claim 7.

19. A liquid crystal display comprising a polymer light-emitting device according to claim 7 as a back light.

* * * * *